United States Patent
Kim et al.

(10) Patent No.: US 10,032,849 B2
(45) Date of Patent: Jul. 24, 2018

(54) ORGANIC LIGHT EMITTING DIODE DISPLAY DEVICE AND MANUFACTURING METHOD THEREOF

(71) Applicant: SAMSUNG DISPLAY CO., LTD., Yongin-si, Gyeonggi-do (KR)

(72) Inventors: Sung Ho Kim, Suwon-si (KR); Jong Moo Huh, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/400,387

(22) Filed: Jan. 6, 2017

(65) Prior Publication Data

US 2017/0352718 A1 Dec. 7, 2017

(30) Foreign Application Priority Data

Jun. 1, 2016 (KR) ........................ 10-2016-0068341

(51) Int. Cl.
| | | |
|---|---|---|
| *H01L 29/08* | (2006.01) | |
| *H01L 21/00* | (2006.01) | |
| *H01L 27/32* | (2006.01) | |
| *H01L 51/56* | (2006.01) | |
| *H01L 27/12* | (2006.01) | |
| *H01L 33/32* | (2010.01) | |

(Continued)

(52) U.S. Cl.
CPC ........ *H01L 27/3279* (2013.01); *H01L 27/124* (2013.01); *H01L 27/1225* (2013.01); *H01L 27/3262* (2013.01); *H01L 51/56* (2013.01); *H01L 33/32* (2013.01); *H01L 51/0545* (2013.01); *H01L 51/5012* (2013.01); *H01L 2227/323* (2013.01)

(58) Field of Classification Search
CPC ............. H01L 51/0545; H01L 51/0036; H01L 51/0541; H01L 51/5012; H01L 27/124; H01L 29/458; H01L 21/775; H01L 29/4968; H01L 33/32; H01L 33/20; H01L 33/0073; H01L 33/008; H01L 51/56
USPC .......... 257/40, 59, 79, 88, 758, 759; 438/22, 438/82, 99, 24, 46, 47
See application file for complete search history.

(56) References Cited

U.S. PATENT DOCUMENTS

| | | | |
|---|---|---|---|
| 6,262,436 B1 | 7/2001 | Franklin et al. | |
| 2004/0061438 A1* | 4/2004 | Yamazaki | ........... H01L 27/1214 313/506 |
| 2005/0134779 A1* | 6/2005 | Park | .................. G02F 1/136286 349/139 |

FOREIGN PATENT DOCUMENTS

| | | |
|---|---|---|
| JP | 05-028557 | 2/1993 |
| JP | 06-150414 | 5/1994 |
| JP | 2006-059397 | 3/2006 |

(Continued)

*Primary Examiner* — Thinh T Nguyen
(74) *Attorney, Agent, or Firm* — F. Chau & Associates, LLC

(57) ABSTRACT

An organic light emitting diode display includes a substrate, a semiconductor, a gate electrode, a source electrode connected to a first portion of the semiconductor, a drain electrode connected to a second portion of the semiconductor, and a pixel electrode connected to the drain electrode. Each of the source electrode, the drain electrode, and the pixel electrode includes a barrier metal layer, a low resistance metal layer, a metal oxide layer, and a contact assistant layer disposed between the low resistance metal layer and the metal oxide layer. The source electrode, the drain electrode, and the pixel electrode each have a step shape.

20 Claims, 18 Drawing Sheets

(51) Int. Cl.
     *H01L 51/50*      (2006.01)
     *H01L 51/05*      (2006.01)

(56) References Cited

FOREIGN PATENT DOCUMENTS

| | | |
|---|---|---|
| JP | 2007-114337 | 5/2007 |
| JP | 2007-142356 | 6/2007 |
| KR | 10-0767461 | 12/2007 |
| KR | 1020100022406 | 3/2010 |
| KR | 20110101759 | 9/2011 |
| KR | 10-1155903 | 6/2012 |
| KR | 1020120060982 | 6/2012 |
| KR | 1020150078352 | 7/2015 |

* cited by examiner

ORGANIC LIGHT EMITTING DIODE DISPLAY DEVICE AND MANUFACTURING METHOD THEREOF

CROSS REFERENCE TO RELATED APPLICATIONS

This application claims priority to and the benefit of Korean Patent Application No. 10-2016-0068341 filed in the Korean Intellectual Property Office on Jun. 1, 2016, the entire contents of which are herein incorporated by reference in its entirety.

TECHNICAL FIELD

The present disclosure relates to a display device, and more particularly, to an organic light emitting diode display device and a manufacturing method thereof.

DISCUSSION OF THE RELATED ART

An organic light emitting diode (OLED) display includes two electrodes and an organic emission layer interposed therebetween. Electrons are injected from one electrode and holes are injected from the other electrode. The electrons and holes are combined within the organic emission layer to generate excitons. The generated excitons release energy, in the form of light, as they relax and in this way light is generated.

OLED display devices generally include a plurality of pixels. Each pixel includes an organic light emitting diode, which is a self-emissive device, and in each pixel, a plurality of thin film transistors is formed for driving the organic light emitting diode. At least one capacitor is also formed in each pixel. The plurality of thin film transistors generally includes both switching thin film transistors and driving thin film transistors.

The electrodes, the organic emission layer, the thin film transistors, etc. are manufactured by performing a photolithograph process that uses multiple masks, and/or uses a same mask multiple times. The processes of using the mask considerably increases a manufacturing cost, and accordingly, as the number of masks increases, the manufacturing cost increases.

SUMMARY

An organic light emitting diode display includes a substrate, a semiconductor, a gate electrode, a source electrode connected to a first portion of the semiconductor, a drain electrode connected to a second portion of the semiconductor, and a pixel electrode connected to the drain electrode. Each of the source electrode, the drain electrode, and the pixel electrode includes a barrier metal layer, a low resistance metal layer, a metal oxide layer, and a contact assistant layer disposed between the low resistance metal layer and the metal oxide layer. The source electrode, the drain electrode, and the pixel electrode each have a step shape.

A method of manufacturing an organic light emitting diode display includes forming a semiconductor on a substrate. A gate electrode is formed on the semiconductor. An interlayer insulating layer is formed on both the semiconductor and the gate electrode. The interlayer insulating layer is patterned to form a contact hole that exposes a first portion and a second portion of the semiconductor. A barrier metal material layer, a low resistance metal material layer, a contact assistant material layer, and a metal oxide material layer are sequentially deposited on the interlayer insulating layer. A source electrode is formed connected to the first portion of the semiconductor, a drain electrode is formed connected to the second portion of the semiconductor, and a pixel electrode is formed connected to the second portion of the semiconductor layer, by patterning the barrier metal material layer, the low resistance metal material layer, the contact assistant material layer, and the metal oxide material layer. The source electrode, the drain electrode, and the pixel electrode are each formed to have a step shape in which a first layer thereof is wider than a second layer thereof, the second layer being disposed directly on the first layer.

An organic light emitting diode display device includes a substrate. A multi-layered source electrode is disposed on the substrate and includes multiple layers that form a step-shape. A multi-layered gate electrode is disposed on the substrate and includes multiple layers that form the step-shape. A multi-layered pixel electrode is disposed on the substrate and includes multiple layers that form the step-shape.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
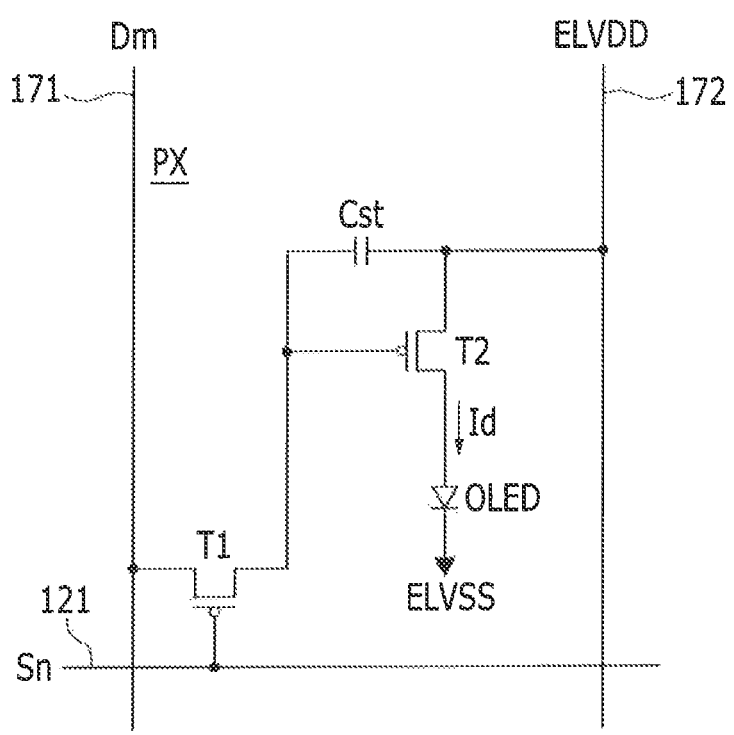
FIG. 1 is a circuit diagram illustrating one pixel of an organic light emitting diode display according to an exemplary embodiment of the present disclosure.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Like reference numerals may designate like elements throughout the specification and the drawings.

In the drawings, the thickness of layers, areas, films, panels, regions, etc., may be exaggerated for clarity.

It will be understood that when an element such as a layer, film, region, or substrate is referred to as being "on" another element, it can be directly on the other element or intervening elements may also be present.

An organic light emitting diode display according to an exemplary embodiment of the present disclosure will now be described with reference to FIG. 1 to FIG. 3.

FIG. 1 is a circuit diagram illustrating one pixel of an organic light emitting diode display according to an exemplary embodiment of the present disclosure.

As shown in FIG. 1, one pixel of the organic light emitting diode display, according to the exemplary embodiment of the present disclosure, includes a plurality of signal lines 121, 171, and 172, a plurality of transistors T1 and T2 connected to the plurality of signal lines, a storage capacitor Cst, and an organic light emitting diode (OLED).

The transistors T1 and 12 include a switching transistor T1 and a driving transistor T2.

The signal lines 121, 171, and 172 include a gate line 121 transmitting a gate signal Sn, a data line 171 crossing the gate line and transmitting a data signal Dm, and a driving voltage line 172 transmitting a driving voltage ELVDD. The driving voltage line 172 is substantially parallel to the data line 171. In FIG. 1, although only one gate line 121, one data line 171, and one driving voltage line 172 are shown, a plurality of gate lines 121, a plurality of data lines 171, and a plurality of driving voltage lines 172 may be provided in each pixel. The plurality of gate lines 121 may be disposed to be parallel to each other, and the plurality of data lines 171 and the plurality of driving voltage lines 172 may be disposed to be parallel to each other.

The switching transistor T1 includes a control terminal, an input terminal, and an output terminal. The control terminal of the switching transistor T1 is connected to the gate line 121. The input terminal of the switching transistor T1 is connected to the data line 171. The output terminal of the switching transistor T1 is connected to the driving transistor T2. The switching transistor T1 transmits a data signal Dm, applied to the data line 171, to the driving transistor T2 in response to a gate signal Sn applied to the gate line 121.

The driving transistor T2 includes a control terminal, an input terminal, and an output terminal. The control terminal of the driving transistor T2 is connected to the switching transistor T1. The input terminal of the driving transistor T2 is connected to the driving voltage line 172. The output terminal of the driving transistor T2 is connected to the organic light emitting diode OLED. The driving transistor T2 outputs a driving current Id, which varies depending on a voltage applied between the control terminal and the output terminal.

The storage capacitor Cst is connected between the control terminal and the input terminal of the driving transistor T2. The storage capacitor Cst is charged by the data signal Dm applied to the control terminal of the driving transistor T2, and maintains the data signal Dm even after the switching transistor T1 is turned off.

The organic light emitting diode (OLED) includes an anode connected to the driving transistor T2 and a cathode connected to a common voltage ELVSS. The OLED displays an image by emitting light, the intensity of which varies depending on the driving current Id of the driving transistor 12.

The switching transistor T1 and the driving transistor T2 may be n-channel field effect transistors (FETs) or p-channel field effect transistors. The path by which the transistors T1 and T2, the storage capacitor Cst, and the OLED are connected to each other may be changed.

The structure of the pixel of the organic light emitting diode display according to the exemplary embodiment of the present disclosure shown in FIG. 1 will be described in detail with reference to FIG. 2 and FIG. 3 as well as FIG. 1.

Figure 2:
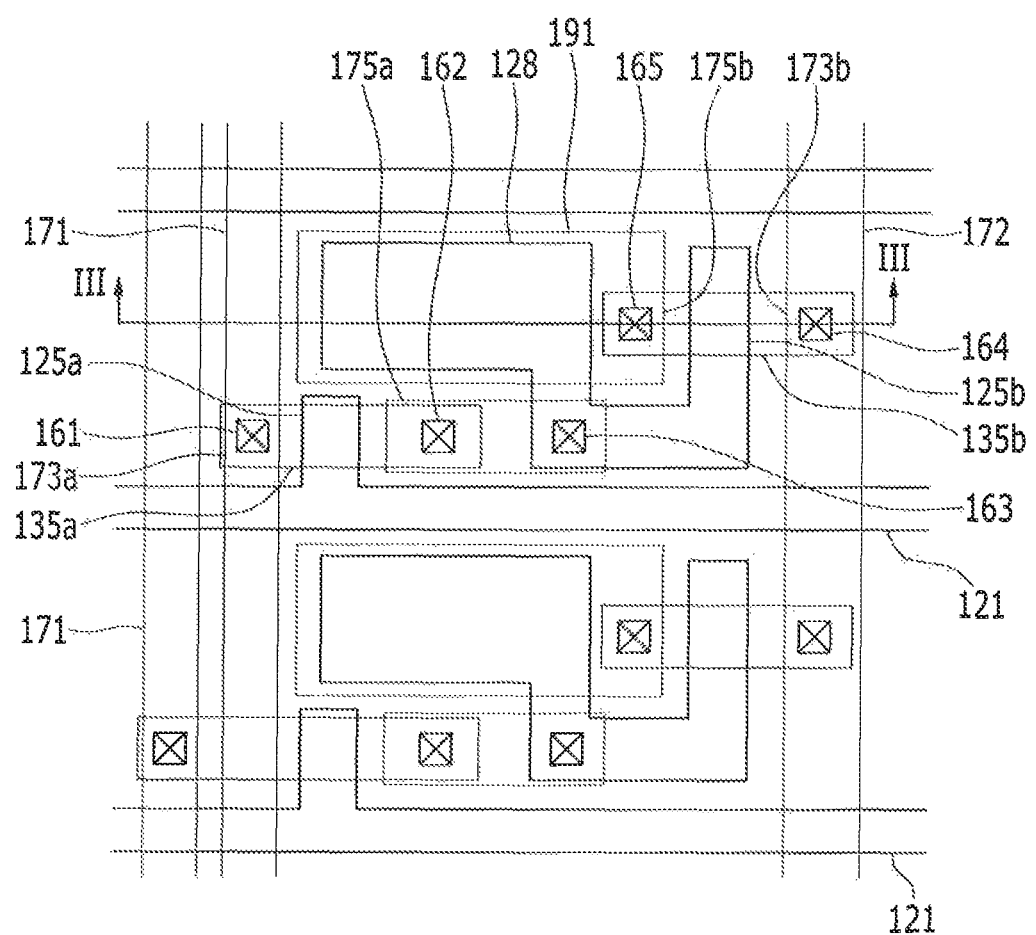
FIG. 2 is a layout view illustrating two adjacent pixels of an organic light emitting diode display according to an exemplary embodiment of the present disclosure.
Figure 3:
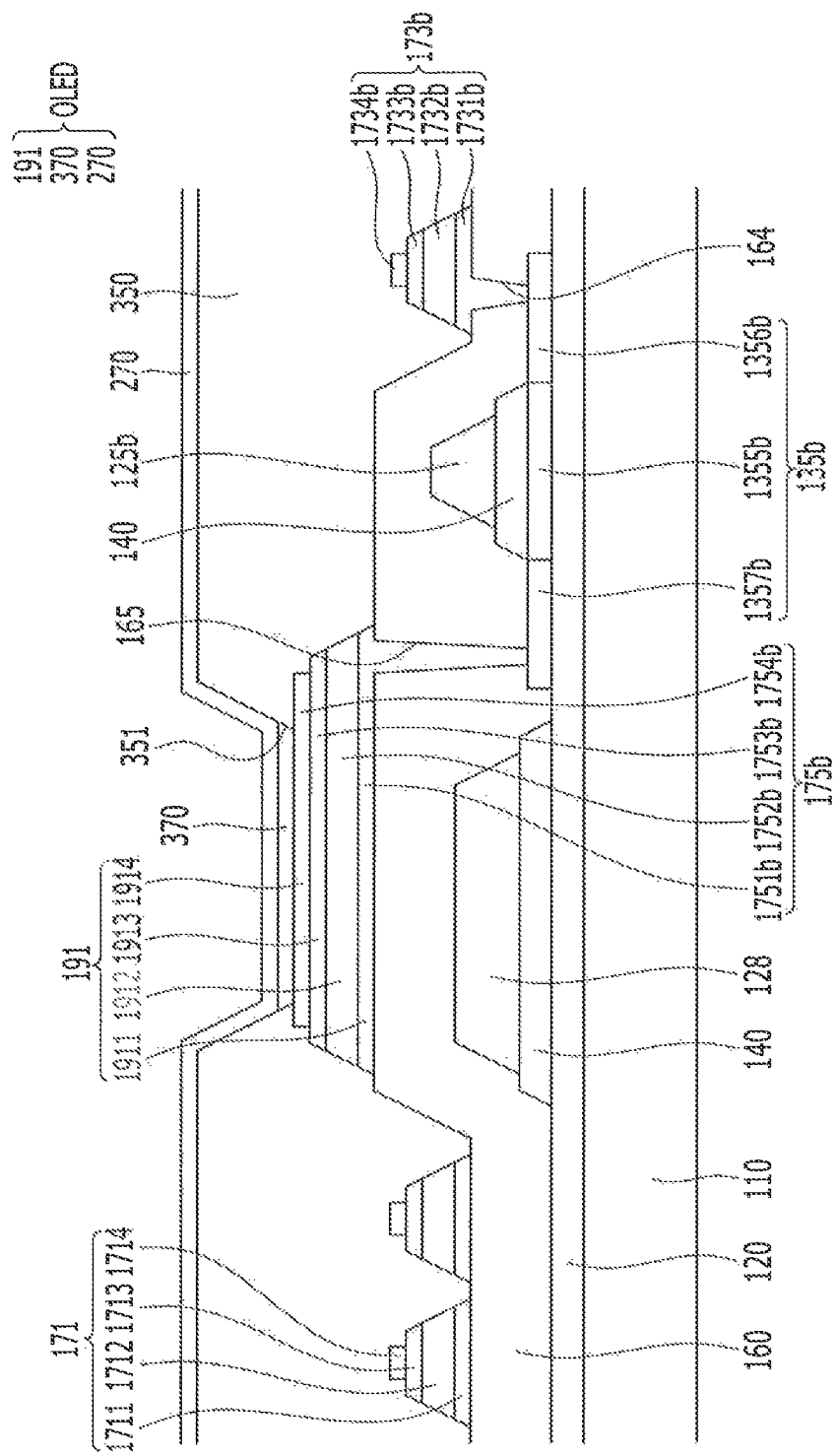
FIG. 3 is a cross-sectional view taken along line III-III of FIG. 2.

FIG. 2 is a layout view illustrating two adjacent pixels of an organic light emitting diode display according to an exemplary embodiment of the present disclosure, and FIG. 3 is a cross-sectional view taken along line Ill-III of FIG. 2.

As shown in FIG. 2 and FIG. 3, in the organic light emitting diode display, according to the exemplary embodiment of the present disclosure, a buffer layer 120 is disposed on a substrate 110.

The substrate 110 may be an insulating substrate and may include glass, quartz, ceramic, plastic, or the like. The substrate 110 may be made of a flexible material.

The buffer layer 120 may be made of a silicon nitride (SiNx) or a silicon oxide (SiOx). The buffer layer 120 may be formed as a single layer or as multiple layers. The buffer layer 120 serves to provide a flat surface while preventing undesirable materials such as impurities or moisture from permeating there through.

Semiconductors 135a and 135b are disposed on the buffer layer 120. The semiconductors 135a and 135b include a switching semiconductor 135a and a driving semiconductor 135b, disposed at positions which are spaced apart from each other. The switching semiconductor 135a or the driving semiconductor 135b may be made of a polycrystalline material or an oxide semiconductor material. Where the switching semiconductor 135a or the driving semiconductor 135b is made of the oxide semiconductor material, an additional protecting layer may be added to protect the oxide semiconductor, as the oxide semiconductor may be vulnerable to various environmental factors such as a high temperature and the like.

The driving semiconductor 135b includes a channel 1355b, a source region 1356b, and a drain region 1357b. The source region 1356b and the drain region 1357b may be disposed at opposite sides of the channel 1355b. The source region 1356b and the drain region 1357b of the driving semiconductor 135b include contact doping regions that may be doped with impurities such as P-type impurities or N-type impurities. The switching semiconductor 135a may also include a channel, a source region, and a drain region, with the source and drain regions being disposed at opposite sides of the channel.

A gate insulating layer 140 is disposed on the switching semiconductor 135a, the driving semiconductor 135b, and the buffer layer 120. The gate insulating layer 140 may include an inorganic insulating material or an organic insulating material such as a silicon nitride (SiNx) or a silicon oxide (SiOx), a silicon oxynitride (SiON), or the like. The gate insulating layer 140 may include a single layer or multiple layers. The gate insulating layer 140 overlaps both a channel of the switching semiconductor 135a and the channel 1355b of the driving semiconductor 135b. The gate insulating layer 140 might not overlap either a source region or a drain region of the switching semiconductor 135a. The gate insulating layer 140 might also not overlap either the source region 1356b or the drain region 1357b of the driving semiconductor 135b.

The gate line 121, a switching gate electrode 125a, a driving gate electrode 125b, and a first storage capacitor plate 128 are disposed on the gate insulating layer 140.

The gate line 121 extends horizontally and transmits the gate signal Sn. The switching gate electrode 125a protrudes from the gate line 121 above the switching semiconductor 135a. The driving gate electrode 125b protrudes from the first storage capacitor plate 128 above the driving semiconductor 135*b*. The switching gale electrode 125*a* and the driving gate electrode 125*b* respectively overlap the channel of the switching semiconductor 135*a* and the channel 1355*b* of the driving semiconductor 135*b*.

An interlayer insulating layer 160 is disposed on the gate line 121, the switching gate electrode 125*a*, the driving gate electrode 125*b*, and the first storage capacitor plate 128. The interlayer insulating layer 160 is includes either an inorganic insulating material or an organic insulating material such as a silicon nitride (SiNx), a silicon oxide (SiOx), a silicon oxynitride (SiON), a silicon oxyfluoride (SiOF), or the like. The interlayer insulating layer 160 may be a single layer or multiple layers.

Contact holes 161 and 162, overlapping at least a portion of the switching semiconductor 135*a*, are formed in the interlayer insulating layer 160. For example, the contact holes 161 and 162 overlap the source region and the drain region of the switching semiconductor 135*a*. In addition, a contact hole 163, overlapping at least a part of the first storage capacitor plate 128, is formed in the interlayer insulating layer 160. Further, contact holes 164 and 165, overlapping at least a portion of the driving semiconductor 135*b*, are formed in the interlayer insulating layer 160. For example, the contact holes 164 and 165 overlap the source region 1356*b* and the drain region 1357*b* of the driving semiconductor 135*b*.

The data line 171, the driving voltage line 172, a switching source electrode 173*a*, a driving source electrode 173*b*, a switching drain electrode 175*a*, a driving drain electrode 175*b*, and a pixel electrode 191 are disposed on the interlayer insulating layer 160. The data line 171, the driving voltage line 172, the switching source electrode 173*a*, the driving source electrode 173*b*, the switching drain electrode 175*a*, the driving drain electrode 175*b*, and the pixel electrode 191 are disposed in the same layer. The data line 171, the driving voltage line 172, the switching source electrode 173*a*, the driving source electrode 173*b*, the switching drain electrode 175*a*, the driving drain electrode 175*b*, and the pixel electrode 191 may be formed as multiple layers.

The data line 171, the driving source electrode 173*b*, the driving drain electrode 175*b*, and the pixel electrode 191 may each include a barrier metal layer (1711, 1731*b*, 1751*b*, 1911), respectively, low resistance metal layers (1712, 1732*b*, 1752*b*, 1912), respectively, contact assistant layers (1713, 1733*b*, 1753*b*, 1913), respectively, and metal oxide layers (1714, 1734*b*, 1754*b*, 1914), respectively. The driving voltage line 172, the switching source electrode 173*a*, and the switching drain electrode 175*a* may include the barrier metal layers, the low resistance metal layers, the contact assistant layers, and the metal oxide layers, as well.

The low resistance metal layers (1712, 1732*b*, 1752*b*, 1912) are disposed on the barrier metal layers (1711, 1731*b*, 1751*b*, 1911), and the metal oxide layers (1714, 1734*b*, 1754*b*, 1914) are disposed on the low resistance metal layers (1712, 1732*b*, 1752*b*, 1912). The contact assistant layers (1713, 1733*b*, 1753*b*, 1913) are disposed between the low resistance metal layers (1712, 1732*b*, 1752*b*, 1912) and the metal oxide layers (1714, 1734*b*, 1754*b*, 1914).

The barrier metal layers (1711, 1731*b*, 1751*b*, 1911) may include a material such as titanium (Ti), molybdenum (Mo), a titanium alloy, and/or a molybdenum alloy. Each thickness of the barrier metal layers (1711, 1731*b*, 1751*b*, 1911) may be equal to or greater than about 300 Å, and may be equal to or less than about 1000 Å.

The low resistance metal layers (1712, 1732*b*, 1752*b*, 1912) may include a material with low resistivity such as aluminum (Al), copper (Cu), an aluminum alloy, and/or a copper alloy. Each thickness of the low resistance metal layers (1712, 1732*b*, 1752*b*, 1912) may be equal to or greater than about 8000 Å, and may be equal to or less than about 14000 Å.

The contact assistant layers (1713, 1733*b*, 1753*b*, 1913) may include an aluminum alloy such as nickel (Ni), lanthanum (La), germanium (Ge), copper (Cu), cobalt (Co), and/or neodymium (Nd). For example, the contact assistant layers (1713, 1733*b*, 1753*b*, 1913) may include an aluminum-nickel-lanthanunm alloy (AlNiLa). The contact assistant layers (1713, 1733*b*, 1753*b*, 1913) may include a material which may increase adhesion between the low resistance metal layers (1712, 1732*b*, 1752*b*, 1912) and the metal oxide layers (1714, 1734*b*, 1754*b*, 1914). Each thickness of the contact assistant layers (1713, 1733*b*, 1753*b*, 1913) may be equal to or greater than about 300 Å, and equal to or less than about 3000 Å.

The metal oxide layers (1714, 1734*b*, 1754*b*, 1914) may include a transparent conductive material with a high work function such as indium tin oxide (ITO), indium zinc oxide (IZO), zinc oxide (ZnO), indium oxide ($In_2O_3$), etc. Each of the metal oxide layers (1714, 1734*b*, 1754*b*, 1914) may have a thickness that is greater than or equal to about 70 Å, and may be equal to or less than about 1000 Å.

Edges of the data line 171, the driving source electrode 173*b*, the driving drain electrode 175*b*, and the pixel electrode 191 may have steps that may be seen in the cross-sectional view. For example, the edges of the data line 171, the driving source electrode 173*b*, the driving drain electrode 175*b*, and the pixel electrode 191 are formed to have a step shape.

As used herein, the step shape may be a shape in which a first layer has a larger width than a second layer, which may be disposed directly upon the first layer in such a way that the center of the first layer is aligned with the center of the second layer. Thus, two portions of the first layer remain uncovered by the second layer and these two uncovered portions are disposed on either side of the second layer.

For example, the steps may be provided between the contact assistant layers (1713, 1733*b*, 1753*b*, 1913) and the metal oxide layers (1714, 1734*b*, 1754*b*, 1914). In the cross-sectional view, the metal oxide layers (1714, 1734*b*, 1754*b*, 1914) are formed to have a narrower width than that of the contact assistant layers (1713, 1733*b*, 1753*b*, 1913). At the edges of the data line 171, the driving source electrode 173*b*, the driving drain electrode 175*b*, and the pixel electrode 191, widths (W) of portions at which the contact assistant layers (1713, 1733*b*, 1753*b*, 1913) are not covered by the metal oxide layers (1714, 1734*b*, 1754*b*, 1914) are equal to or greater than about 0.1 μm.

The contact assistant layers (1713, 1733*b*, 1753*b*, 1913), the low resistance metal layers (1712, 1732*b*, 1752*b*, 1912), and barrier metal layers (1711, 1731*b*, 1751*b*, 1911) have a taper shape.

The data line 171 transmits a data signal (Dm), and extends in a direction that crosses the gate line 121. The driving voltage line 172 transmits a driving voltage (ELVDD), and the driving voltage line 172 is spaced apart from the data line 171, while extending in a direction parallel to the data line 171.

The switching source electrode 173*a* is connected to the data line 171, and overlaps the switching semiconductor 135*a*. The switching source electrode 173*a* is connected to the source region of the switching semiconductor 135*a* through the contact hole 161. The driving source electrode 173*b* is connected to the driving voltage line 172, and overlaps the driving semiconductor 135b. The driving source electrode 173b is connected to the source region 1356b of the driving semiconductor 135b through the contact hole 164.

The switching drain electrode 175a faces the switching source electrode 173a, and is connected to the drain region of the switching semiconductor 135a through the contact hole 162. The driving drain electrode 175b faces the driving source electrode 173b, and is connected to the drain region 1357b of the driving semiconductor 135b through the contact hole 165.

The switching drain electrode 175a at least partially overlaps the driving gate electrode 125b. The switching drain electrode 175a is electrically connected to the first storage capacitor plate 128 and the driving gate electrode 125b through the contact hole 163.

The pixel electrode 191 is connected to the driving drain electrode 175b, and serves as an anode of the organic light emitting diode (OLED). The pixel electrode 191 is disposed in the same layer as the driving drain electrode 175b. The driving drain electrode 175b and the pixel electrode 191 are integrally formed. The pixel electrode 191 overlaps the first storage capacitor plate 128. Accordingly, the first storage capacitor plate 128 and the pixel electrode 191 form the storage capacitor Cst, using the interlayer insulating layer 160 as a dielectric material.

The switching transistor T1 includes the switching semiconductor 135a, the switching gate electrode 125a, the switching source electrode 173a, and the switching drain electrode 175a. The driving transistor T2 includes the driving semiconductor 135b, the driving gate electrode 125b, the driving source electrode 173b, and the driving drain electrode 175b.

A pixel defining layer 350 is disposed on the data line 171, the driving voltage line 172, the switching source electrode 173a, the driving source electrode 173b, the switching drain electrode 175a, the driving drain electrode 175b, and the pixel electrode 191. The pixel defining layer 350 includes a pixel opening 351 exposing the pixel electrode 191. The pixel defining layer 350 may include a resin such as a polyacrylate resin and a polyimide resin, and/or a silica-based inorganic material.

An organic emission layer 370 is provided in the pixel opening 351 of the pixel defining layer 350. The organic emission layer 370 may include an emission layer, a hole injection layer (HIL), a hole transporting layer (HTL), an electron transporting layer (ETL), and/or an electron injection layer (EIL). When the organic emission layer 370 includes all of these layers, the hole injection layer is disposed on the pixel electrode 191 which is an anode electrode, and the hole transporting layer, the emission layer, the electron transporting layer, and the electron injection layer may be sequentially stacked on the hole injection layer.

The organic emission layer 370 may include a red organic emission layer for emitting red light, a green organic emission layer for emitting green light, and a blue organic emission layer for emitting blue light. The red organic emission layer, the green organic emission layer, and the blue organic emission layer are respectively formed in red, green, and blue pixels to display a color image.

Alternatively, in the organic light emission layer 370, a color image may be implemented by respectively stacking the red, green, and blue organic light emission layers on the red pixel, the green pixel, and the blue pixel. Red, green, and blue color filters may be formed for each pixel. According to one exemplary embodiment of the present invention, a color image may be displayed by forming a white organic emission layer emitting white light on each of the red, green, and blue pixels and respectively forming red, green, and blue color filters for each pixel. When the color image is displayed by using the white organic emission layer and the color filters, a deposition mask is not needed for depositing the red, green, and blue organic emission layers on each pixel.

The white organic emission layer, in accordance with an exemplary embodiment of the present invention, may be formed as a single organic emission layer, and may further include a structure for emitting white light that includes a plurality of organic emission layers laminated to each other. For example, a structure for emitting white light by combining at least one yellow organic emission layer with at least one blue organic emission layer, a structure for emitting white light by combining at least one cyan organic emission layer with at least one red organic emission layer, and a structure for emitting white light by combining at least one magenta organic emission layer with at least one green organic emission layer may be included.

A common electrode 270 is disposed on the pixel defining layer 350 and the organic emission layer 370. The common electrode 270 may include a transparent conductive material such as indium tin oxide (ITO), indium zinc oxide (IZO), zinc oxide (ZnO), indium oxide ($In_2O_3$), etc. The common electrode 270 may act as the cathode of the OLED. The pixel electrode 191, the organic emission layer 370, and the common electrode 270 may form the OLED.

Hereinafter, a method of manufacturing the organic light emitting diode display according to an exemplary embodiment of the present disclosure will be described in detail with reference to FIG. 4 to FIG. 10.

FIGS. 4 to 10 are cross-sectional views illustrating a method for manufacturing the organic light emitting diode display according to an exemplary embodiment of the present disclosure.

Figure 4:
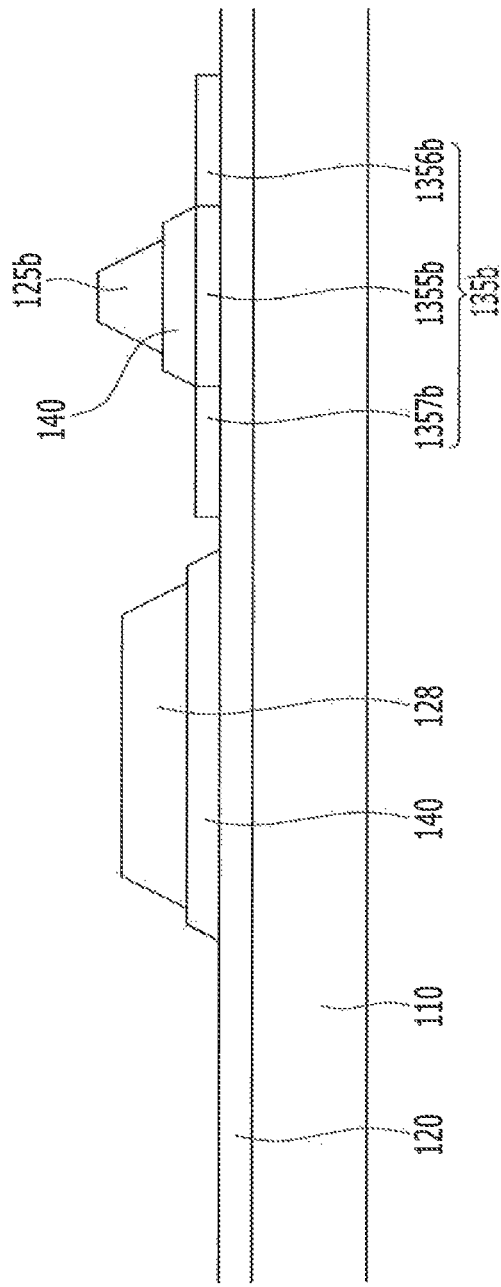
FIGS. 4 to 10 are cross-sectional views illustrating a method of manufacturing an organic light emitting diode display according to an exemplary embodiment of the present disclosure.

As shown in FIG. 4, the buffer layer 120 is formed on the substrate 110. The switching semiconductor 135a and the driving semiconductor 135b are formed by depositing a semiconductor material on the buffer layer 120 and then patterning the semiconductor material. In this case, the switching semiconductor 135a and the driving semiconductor 135b are intrinsic semiconductors in which impurities are not doped.

An inorganic insulating material or an organic insulating material, such as a silicon nitride (SiNx), a silicon oxide (SiOx), or a silicon oxynitride (SiON), is deposited on the switching semiconductor 135a and the driving semiconductor 135b. Then a metal material is deposited over the insulating material (the inorganic insulating material or the organic insulating material). The gate line 121, the switching gate electrode 125a, the driving gate electrode 125b, and the first storage capacitor plate 128 are formed by patterning the metal material. The gate insulating layer 140 is formed by using the gate line 121, the switching gate electrode 125a, the driving gate electrode 125b, and the first storage capacitor plate 128 as a mask and patterning the inorganic insulating material or the organic insulating material. The insulating material (the inorganic insulating material or the organic insulating material) may be continuously deposited, and in this case, the gate insulating layer 140 may be formed with multiple layers.

A doping process of injecting impurity ions is performed by using the switching gate electrode 125a and the driving gate electrode 125b as a mask. The driving semiconductor 135b overlaps the gate insulating layer 140 and the driving gate electrode 125b to include the source region 1356b and the drain region 1357b positioned at opposite sides of the channel 1355b and the channel 1355b into which the impurity ions are not injected. The source region 1356b and the drain region 1357b do not overlap the gate insulating layer 140 and the driving gate electrode 125b, and the impurity ions are injected therein. In a like manner, the switching semiconductor 135a includes a channel, a source region, and a drain region.

Figure 5:
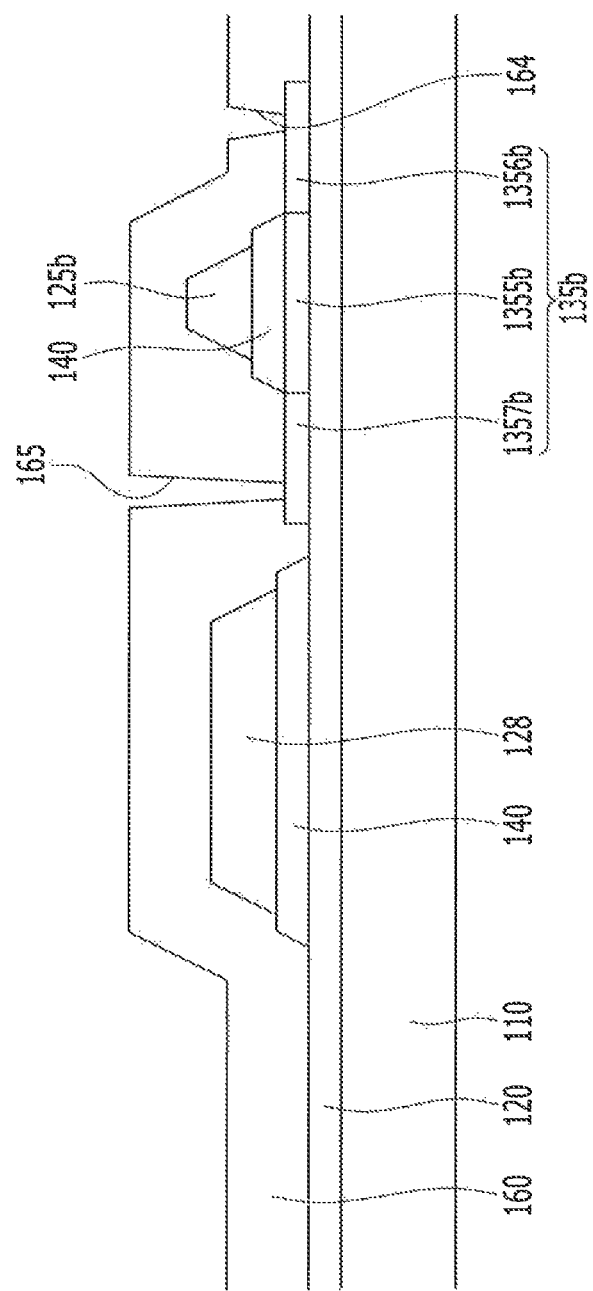

As shown in FIG. 5, the interlayer insulating layer 160 is formed by depositing an inorganic insulating material or an organic insulating material such as a silicon nitride (SiNx), a silicon oxide (SiOx), a silicon oxynitride (SiON), or a silicon oxyfluoride (SiOF) on the gate line 121, the switching gate electrode 125a, the driving gate electrode 125b, the first storage capacitor plate 128, the switching semiconductor 135a, the driving semiconductor 135b, and the buffer layer 120. The insulating material (the inorganic insulating material or the organic insulating material) may be continuously deposited, and in this case, the interlayer insulating layer 160 may be formed as multiple layers.

By patterning the interlayer insulating layer 160, the contact holes 161, 162, 163, 164, 165 are formed. The contact holes 161 and 162 expose at least some of the switching semiconductor 135a. The contact hole 163 exposes at least some of the first storage capacitor plate 128. The contact holes 164 and 165 expose at least some of the driving semiconductor 135b. The contact holes 161 and 162 also expose the source region and the drain region of the switching semiconductor 135a, and the contact holes 164 and 165 also expose the source region 1356b and the drain region 1357b of the driving semiconductor 135b.

Figure 6:
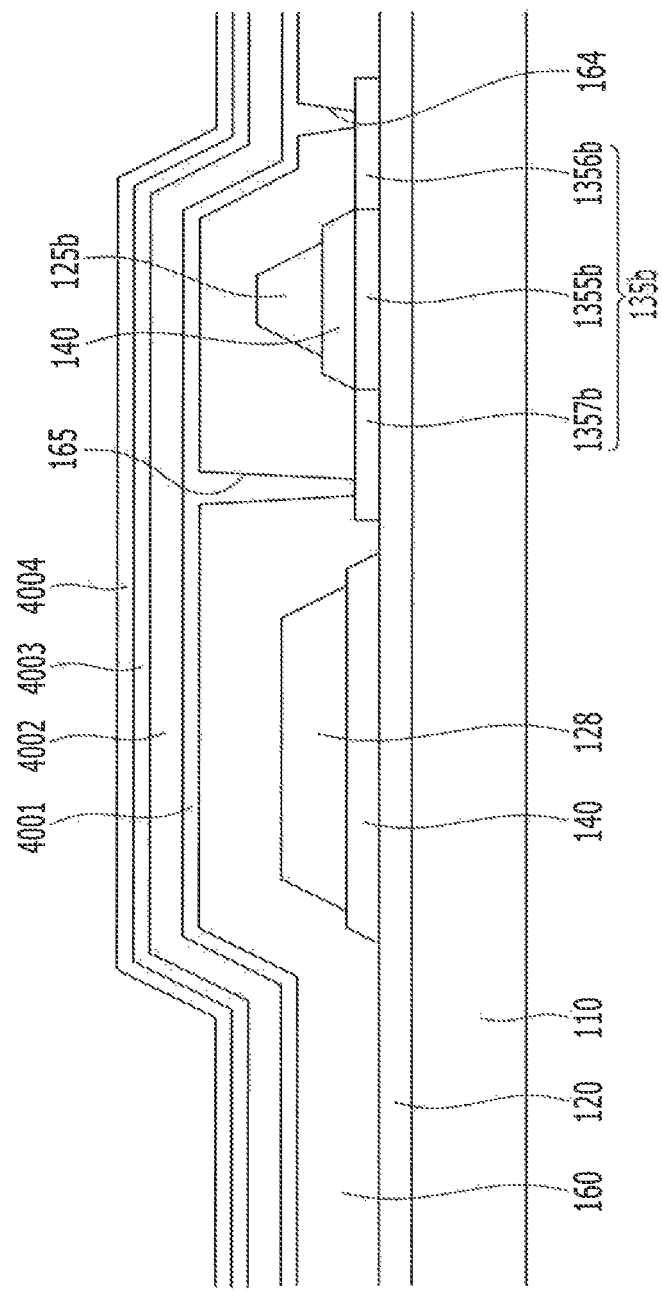

As shown in FIG. 6, a barrier metal material layer 4001, a low resistance metal material layer 4002, a contact assistant material layer 4003, and a metal oxide material layer 4004 are sequentially deposited on the interlayer insulating layer 160.

The barrier metal material layer 4001 may include titanium (Ti), molybdenum (Mo), a titanium alloy, and/or a molybdenum alloy. A thickness of the barrier metal material layer 4001 may be equal to or greater than about 300 Å and equal to or less than about 1000 Å.

The low resistance metal material layer 4002 may include a material having low resistivity such as aluminum (Al), copper (Cu), an aluminum alloy, and/or a copper alloy. A thickness of the low resistance metal material layer 4002 may be equal to or greater than about 8000 Å and equal to or less than about 14000 Å.

The contact assistant material layer 4003 may be made of an aluminum alloy including nickel (Ni), lanthanum (La), germanium (Ge), copper (Cu), cobalt (Co), and/or neodymium (Nd). For example, the contact assistant material layer 4003 may be made of an aluminum-nickel-lanthanum alloy (AlNiLa). The contact assistant material layer 4003 may be made of a material which may increase adhesion between the low resistance metal material layer 4002 and the metal oxide material layer 4004. A thickness of the contact assistant material layer 4003 may be equal to or greater than about 300 Å and equal to or less than about 3000 Å.

The metal oxide material layer 4004 may include a transparent conductive material with a high work function such as indium tin oxide (ITO), indium zinc oxide (IZO), zinc oxide (ZnO), indium oxide ($In_2O_3$), etc. A thickness of the metal oxide material layer 4004 may be equal to or greater than about 70 Å and equal to or less than about 1000 Å.

Figure 7:
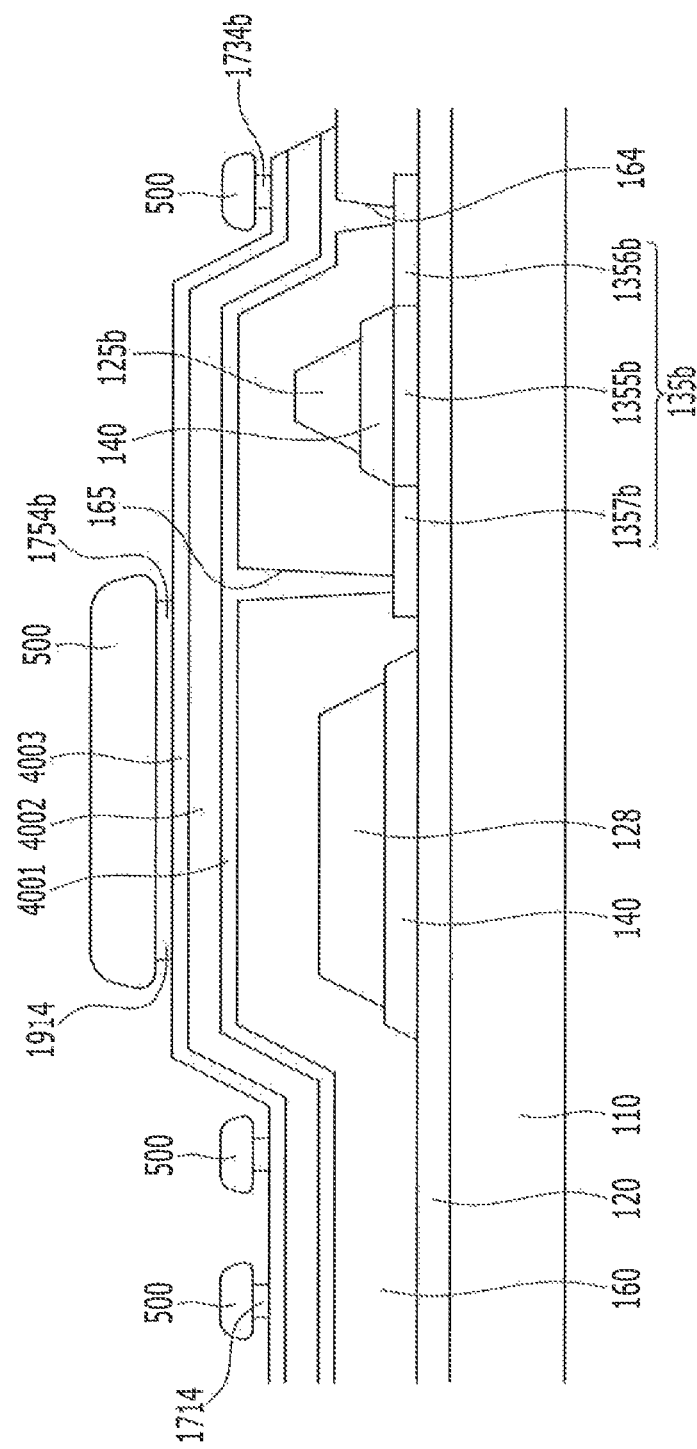

As shown in FIG. 7, a photoresist 500 is coated on the metal oxide material layer 4004, and the photoresist 500 is patterned by positioning a mask on the photoresist 500, irradiating light thereon, and performing a developing process.

The metal oxide layers (1714, 1734b, 1754b, 1914) are formed by etching the metal oxide material layer 4004 by using the patterned photoresist 500 as a mask. In this case, the metal oxide material layer 4004 is patterned by a wet etching process. The metal oxide layers (1714, 1734b, 1754b, 1914) include a metal oxide layer 1714 of the data line 171, a metal oxide layer 1734b of the driving source electrode 173b, a metal oxide layer 1754b of the driving drain electrode 175b, and a metal oxide layer 1914 of the pixel electrode 191. The driving voltage line 172, the switching source electrode 173a, and the switching drain electrode 175a respectively include a metal oxide layer.

Figure 8:
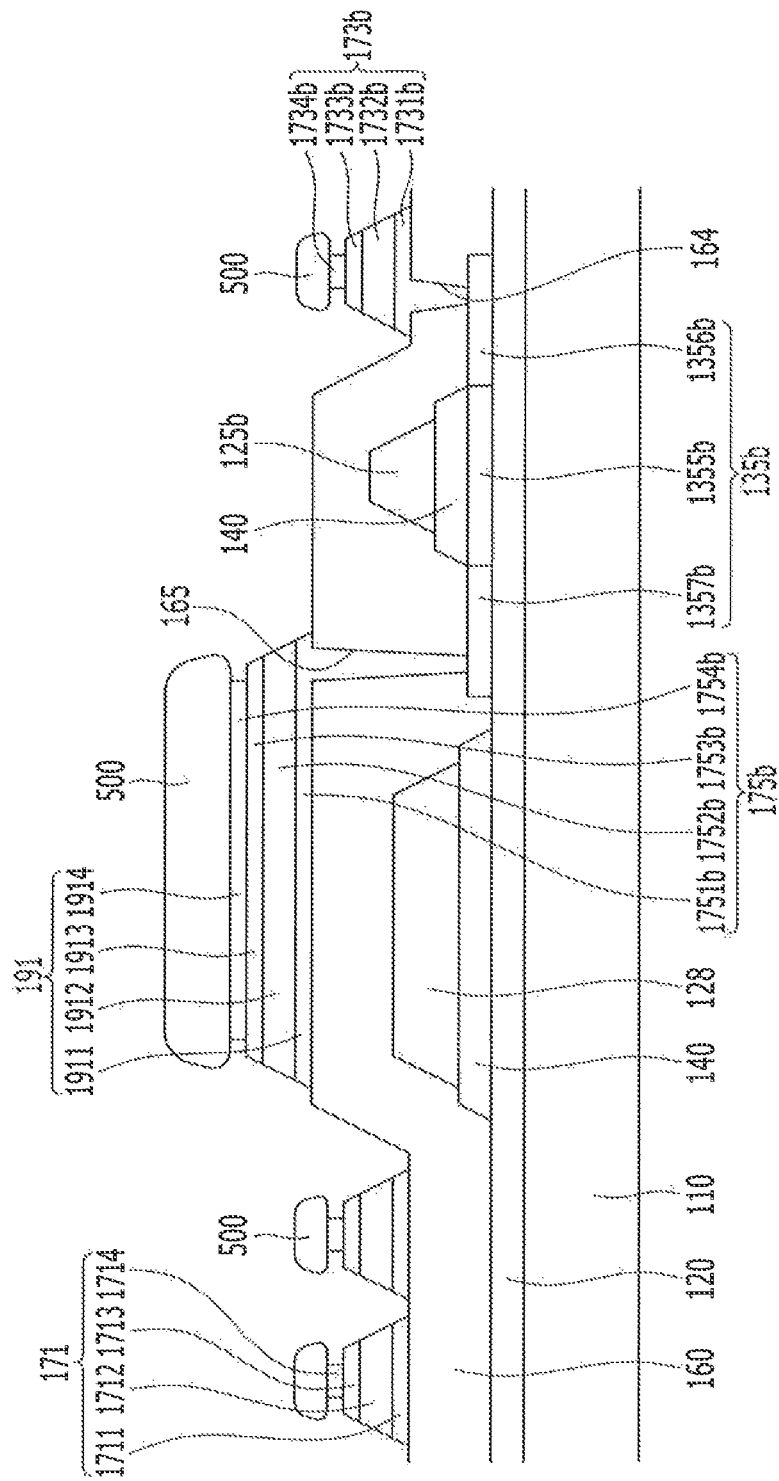

As shown in FIG. 8, the barrier metal layers (1711, 1731b, 1751b, 1911), the low resistance metal layers (1712, 1732b, 1752b, 1912), and the contact assistant layers (1713, 1733b, 1753b, 1913) are formed by using the photoresist 500 as a mask and etching the barrier metal material layer 4001, the low resistance metal material layer 4002, and the contact assistant material layer 4003. In this case, the barrier metal material layer 4001, the low resistance metal material layer 4002, and the contact assistant material layer 4003 are patterned by using a dry etching process.

The barrier metal layers (1711, 1731b, 1751b, 1911) include the barrier metal layer 1711 of the data line 171, the barrier metal layer 1731b of the driving source electrode 173b, the barrier metal layer 1751b of the driving drain electrode 175b, and the barrier metal layer 1911 of the pixel electrode 191. The driving voltage line 172, the switching source electrode 173a, and the switching drain electrode 175a respectively include a barrier metal layer.

The low resistance metal layers (1712, 1732b, 1752b, 1912) include the low resistance metal layer 1712 of the data line 171, the low resistance metal layer 1732b of the driving source electrode 173b, the low resistance metal layer 1752b of the driving drain electrode 175b, and the low resistance metal layer 1912 of the pixel electrode 191. The driving voltage line 172, the switching source electrode 173a, and the switching drain electrode 175a each include a low resistance metal layer.

The contact assistant layers (1713, 1733b, 1753b, 1913) include the contact assistant layer 1713 of the data line 171, the contact assistant layer 1733b of the driving source electrode 173b, the contact assistant layer 1753b of the driving drain electrode 175b, and the contact assistant layer 1913 of the pixel electrode 191. The driving voltage line 172, the switching source electrode 173a, and the switching drain electrode 175a may each include a contact assistant layer.

According to an exemplary embodiment of the present invention, the metal oxide material layer 4004 is wet-etched, and the barrier metal material layer 4001, the low resistance metal material layer 4002, and the contact assistant material layer 4003 are dry-etched. Since the data line 171, the driving source electrode 173b, the driving drain electrode 175b, and the pixel electrode 191 are patterned by two processes, stepped shapes may be formed at the edges of the pixel electrodes 191. For example, the edges of the data line 171, the driving source electrode 173b, the driving drain electrode 175b, and the pixel electrode 191 are formed to have a step shape. Particularly, there may be steps disposed between the contact assistant layers (1713, 1733b, 1753b, 1913) and the metal oxide layers (1714, 1734b, 1754b, 1914).

Since isotropic etching is performed through the wet etching, a desired pattern should be designed to be larger than the expected result. Accordingly, in dry etching, the expected result may be more similar to the designed pattern, as compared to wet etching. Since the metal oxide material layer 4004 might not be properly patterned by a dry etching process, according to an exemplary embodiment of the present invention, only the metal oxide material layer 4004 is patterned by a wet etching process. The barrier metal material layer 4001, the low resistance metal material layer 4002, and the contact assistant material layer 4003, excluding the metal oxide material layer 4004, are patterned by the dry etching process, thereby reducing the design margin.

According to an exemplary embodiment of the present invention, the data line 171, the driving voltage line 172, the switching source electrode 173a, the driving source electrode 173b, the switching drain electrode 175a, the driving drain electrode 175b, and the pixel electrode 191 are simultaneously formed by using a single mask. Accordingly, compared to the case that the data line 171, the driving voltage line 172, the switching source electrode 173a, the driving source electrode 173b, the switching drain electrode 175a, and the driving drain electrode 175b are patterned by a single mask and the pixel electrode 191 is patterned by using a separate mask. Accordingly, one mask may be eliminated, thereby simplifying a manufacturing process and reducing costs.

Figure 9:
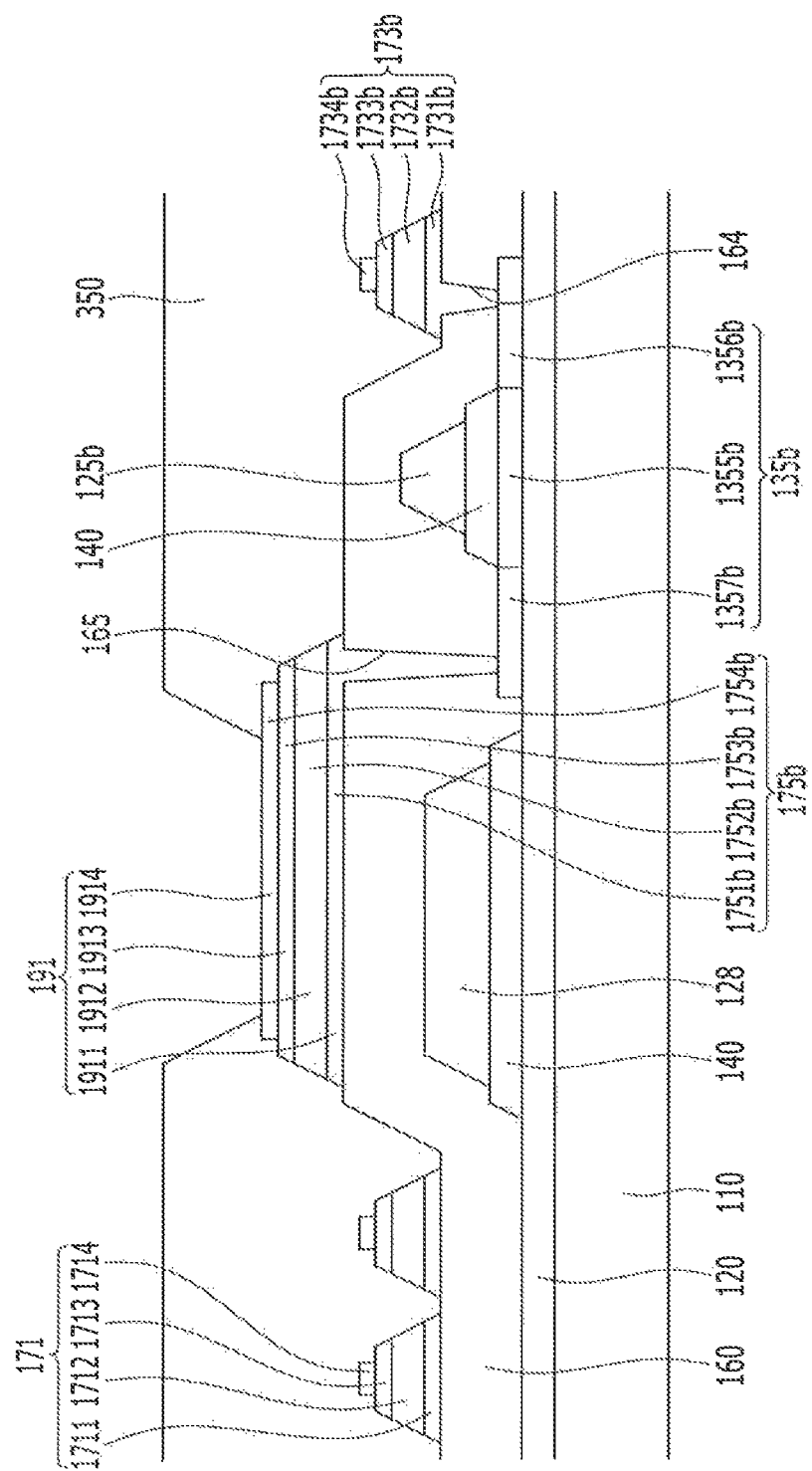

After removing the photoresist 500, as shown in FIG. 9, the pixel defining layer 350 is formed by using a resin such as a polyacrylate resin or a polyimide resin, a silica-based inorganic material, or the like. The pixel opening 351, which exposes the pixel electrode 191, is formed by patterning the pixel defining layer 350.

Figure 10:
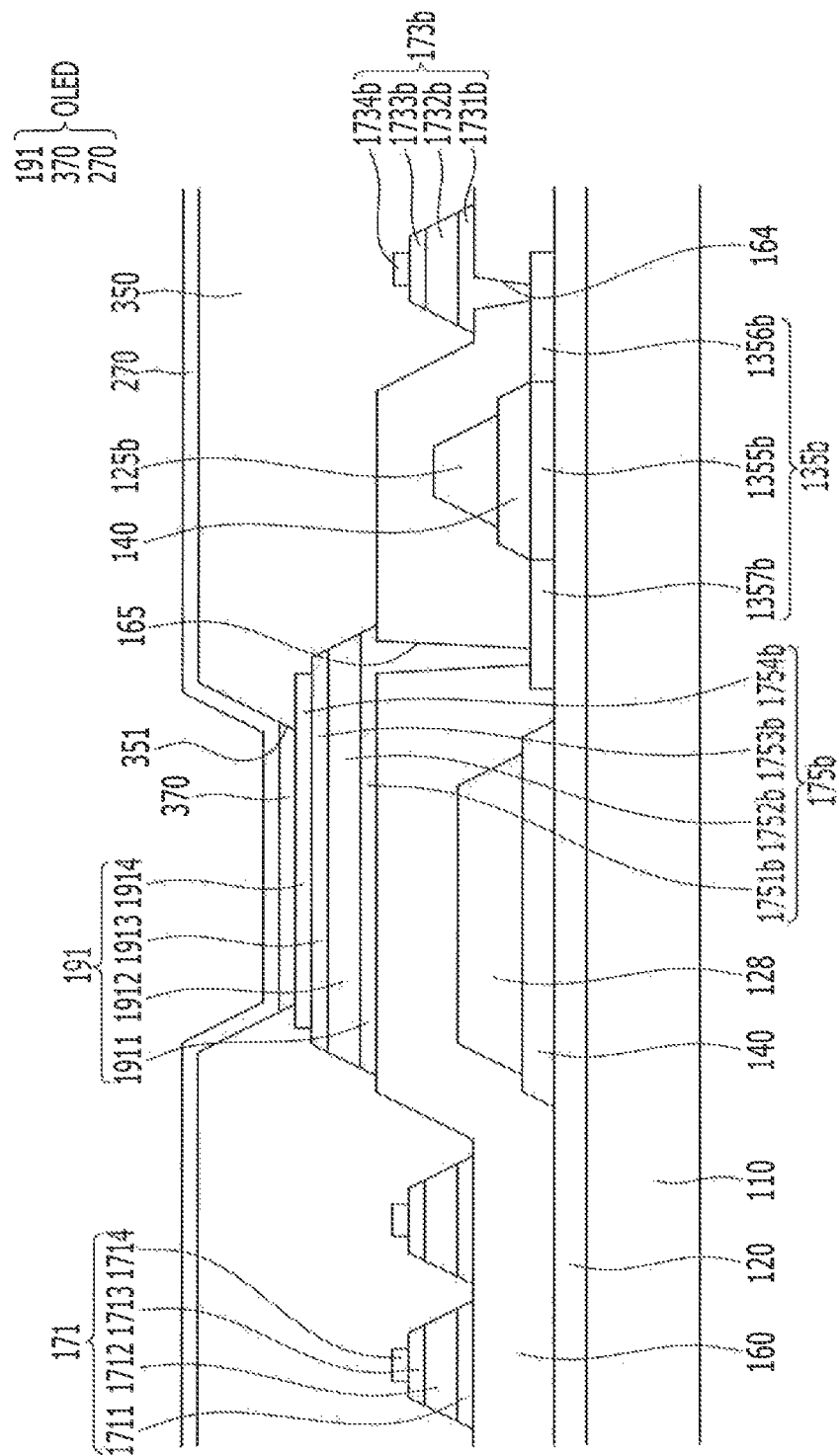

As shown in FIG. 10, the organic emission layer 370 is formed in the pixel opening 351. The common electrode 270 is formed with a transparent conductive material such as indium tin oxide (ITO), indium zinc oxide (IZO), zinc oxide (ZnO), or indium oxide (In$_2$O$_3$) on the pixel defining layer 350 and the organic emission layer 370.

An organic light emitting diode display according to an exemplary embodiment of the present disclosure will now be described with reference to FIG. 11.

Figure 11:
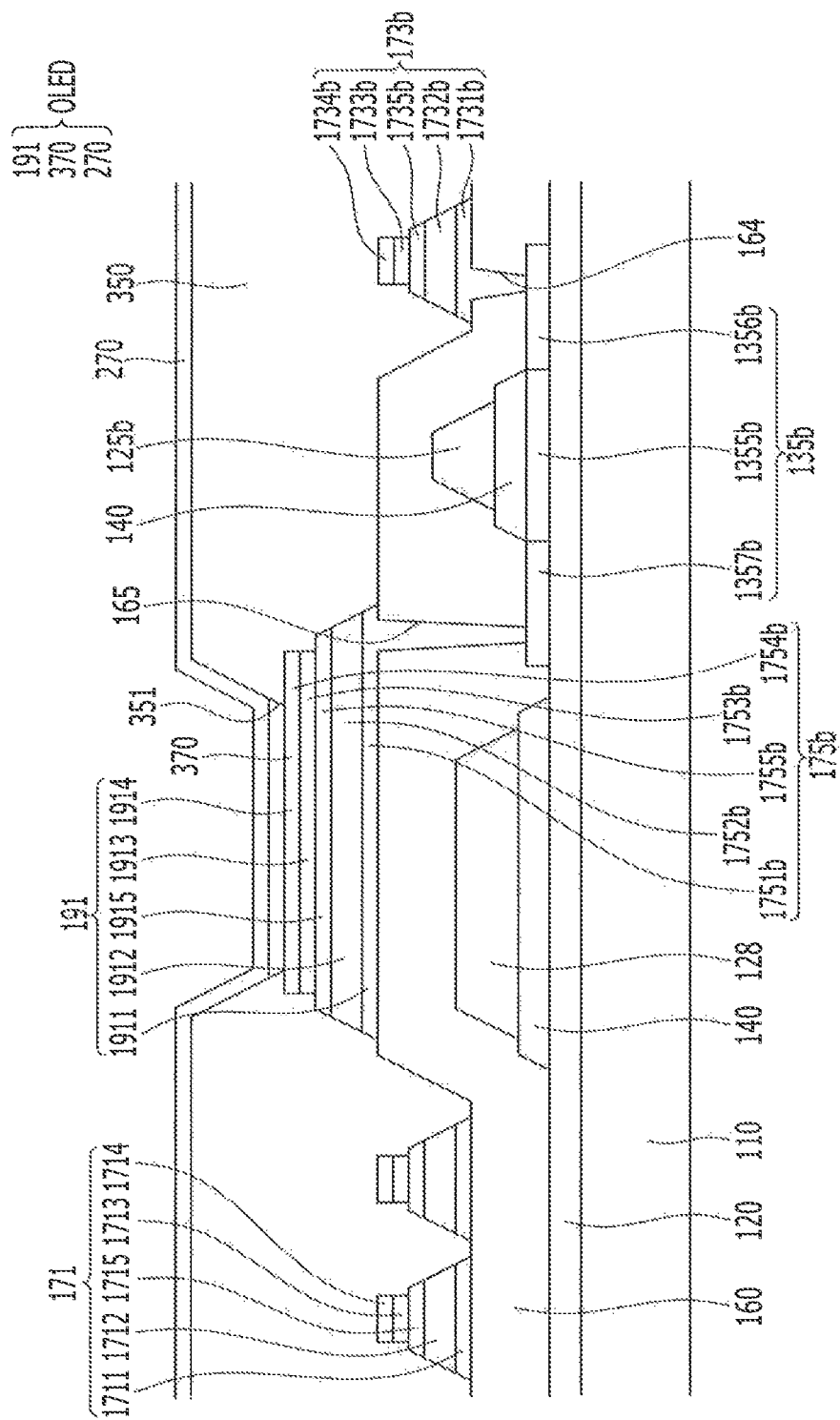
FIG. 11 is a cross-sectional view illustrating an organic light emitting diode display according to an exemplary embodiment of the present disclosure.

The organic light emitting diode display according to an exemplary embodiment of the present disclosure shown in FIG. 11 includes many portions that are the same as in the organic light emitting diode display according to the exemplary embodiment of the present disclosure shown in FIG. 1 to FIG. 3. Accordingly, it may be assumed that where elements of FIG. 11 are not separately described, these elements may be assumed to be similar to, or identical to, the corresponding elements described with respect to FIGS. 1-3. In the present exemplary embodiment, the feature in which the data line, the driving source electrode, the driving drain electrode, and the pixel electrode further include an etch stopping layer is different from the previous exemplary embodiment, and these differences will now be described in detail.

FIG. 11 illustrates a cross-sectional view of an organic light emitting diode display according to an exemplary embodiment of the present disclosure.

In the organic light emitting diode display according to the exemplary embodiment of the present disclosure, the buffer layer 120 is disposed on the substrate 110, the driving semiconductor 135b is disposed on the buffer layer 120, and the gate insulating layer 140 is disposed on both the buffer layer 120 and the driving semiconductor 135b. The driving gate electrode 125b and the first storage capacitor plate 128 are each disposed on the gate insulating layer 140. The interlayer insulating layer 160 is disposed on both the driving gate electrode 125b and the first storage capacitor plate 128.

The data line 171, the driving source electrode 173b, the driving drain electrode 175b, and the pixel electrode 191 are each disposed on the interlayer insulating layer 160. The data line 171, the driving source electrode 173b, the driving drain electrode 175b, and the pixel electrode 191 are all disposed in the same layer.

The data line 171, the driving source electrode 173b, the driving drain electrode 175b, and the pixel electrode 191 include the barrier metal layers (1711, 1731b, 1751b, 1911), respectively, the low resistance metal layers (1712, 1732b, 1752b, 1912), respectively, the etch stopping layers (1715, 1735b, 1755b, 1915), respectively, the contact assistant layers (1713, 1733b, 1753b, 1913), respectively, and the metal oxide layers (1714, 1734b, 1754b, 1914), respectively. The driving voltage line, the switching source electrode, and the switching drain electrode may each include the barrier metal layer, the low resistance metal layer, the etch stopping layer, the contact assistant layer, and the metal oxide layer.

The low resistance metal layers (1712, 1732b, 1752b, 1912) are disposed on the barrier metal layers (1711, 1731b, 1751b, 1911), respectively, and the metal oxide layers (1714, 1734b, 1754b, 1914) are disposed on the low resistance metal layers (1712, 1732b, 1752b, 1912), respectively. The contact assistant layers (1713, 1733b, 1753b, 1913) are disposed between the low resistance metal layers (1712, 1732b, 1752b, 1912) and the metal oxide layers (1714, 1734b, 1754b, 1914), respectively. The etch stopping layers (1715, 1735b, 1755b, 1915) are disposed between the low resistance metal layers (1712, 1732b, 1752b, 1912) and the contact assistant layers (1713, 1733b, 1753b, 1913), respectively.

The etch stopping layers (1715, 1735b, 1755b, 1915) may be made of the same material as the barrier metal layers (1711, 1731b, 1751b, 1911). The etch stopping layers (1715, 1735b, 1755b, 1915) may include titanium (Ti), molybdenum (Mo), a titanium alloy, and/or a molybdenum alloy.

Edges of the data line 171, the driving source electrode 173b, a driving drain electrode 175b, and the pixel electrode 191 have a step shape that may be seen in the cross-sectional view. For example, the edges of the data line 171, the driving source electrode 173b, the driving drain electrode 175b, and the pixel electrode 191 are formed to have a step shape. These steps may be formed between the etch stopping layers (1715, 1735b, 1755b, 1915) and the contact assistant layers (1713, 1733b, 1753b, 1913), respectively. In the cross-sectional view, the contact assistant layers (1713, 1733b, 1753b, 1913) are formed to have a smaller width than those of the etch stopping layers (1715, 1735b, 1755b, 1915). At the edges of the data line 171, the driving source electrode 173b, the driving drain electrode 175b, and the pixel electrode 191, widths (W) of portions at which the etch stopping layers (1715, 1735b, 1755b. 1915) are not covered by the contact assistant layers (1713, 1733b, 1753b, 1913) are equal to or greater than about 0.1 Gm. The etch stopping layers (1715, 1735b, 1755b, 1915), the low resistance metal layers (1712, 1732b, 1752b, 1912), and the barrier metal layers (1711, 1731b, 1751b, 1911) are formed to have a taper shape.

The organic emission layer 370 is disposed on the pixel electrode 191, and the common electrode 270 is disposed on the organic emission layer 370 and the pixel defining layer 350.

Hereinafter, a method of manufacturing the organic light emitting diode display according to an exemplary embodiment of the present disclosure will be described with reference to FIG. 12 to FIG. 16.

FIGS. 12 to 16 are cross-sectional views illustrating a method of manufacturing the organic light emitting diode display according to the exemplary embodiment of the present disclosure.

Figure 12:
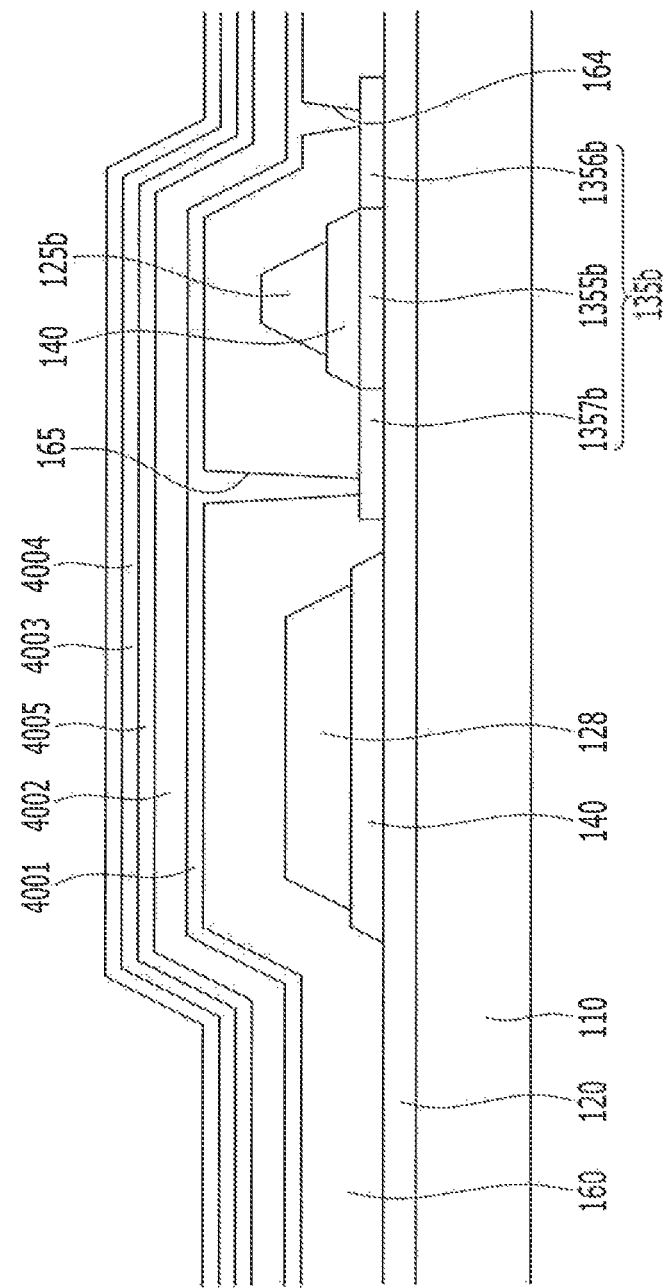
FIGS. 12 to 16 are cross-sectional views illustrating a method of manufacturing an organic light emitting diode display according to an exemplary embodiment of the present disclosure.

As shown in FIG. 12, the buffer layer 120 is disposed on the substrate 110, the driving semiconductor 135b is disposed on the buffer layer 120, and the gate insulating layer 140 is disposed on the buffer layer 120 and the driving semiconductor 135b. The driving gate electrode 125b and the first storage capacitor plate 128 are disposed on the gate insulating layer 140, and the interlayer insulating layer 160 is disposed on the driving gate electrode 125b and the first storage capacitor plate 128.

The barrier metal material layer 4001, the low resistance metal material layer 4002, an etch stopping material layer 4005, the contact assistant material layer 4003, and the metal oxide material layer 4004 are sequentially deposited on the interlayer insulating layer 160.

The etch stopping material layer 4005 may be made of the same material as the barrier metal material layer 4001. The etch stopping material layer 4005 may include titanium (Ti), molybdenum (Mo), a titanium alloy, and/or a molybdenum alloy.

Figure 13:
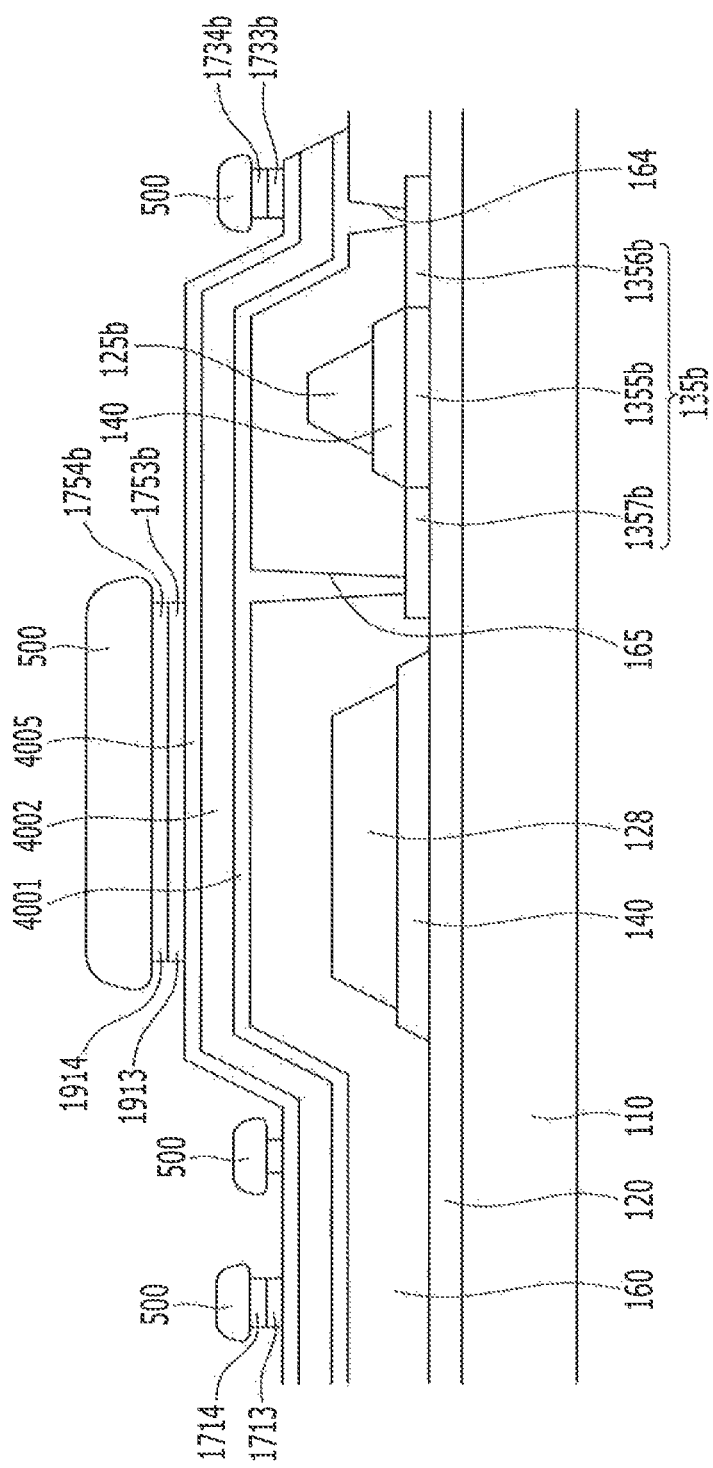

As shown in FIG. 13, the photoresist 500 is coated on the metal oxide material layer 4004, where it may then be patterned.

The contact assistant layers (1713, 1733b, 1753b, 1913) and the metal oxide layers (1714, 1734b, 1754b, 1914) are formed by using the patterned photoresist 500 as a mask and etching the contact assistant material layer 4003 and the metal oxide material layer 4004. In this case, the metal oxide material layer 4004 and the contact assistant material layer 4003 may be patterned and then etched by a wet etching process.

The contact assistant layers (1713, 1733b, 1753b, 1913) include the contact assistant layer 1713 of the data line 171, the contact assistant layer 1733b of the driving source electrode 173b, the contact assistant layer 1753b of the driving drain electrode 175b, and the contact assistant layer 1913 of the pixel electrode 191. The driving voltage line, the switching source electrode, and the switching drain electrode may each include a contact assistant layer.

The metal oxide layers (1714, 1734b, 1754b, 1914) include the metal oxide layer 1714 of the data line 171, the metal oxide layer 1734b of the driving source electrode 173b, the metal oxide layer 1754b of the driving drain electrode 175b, and the metal oxide layer 1914 of the pixel electrode 191. The driving voltage line, the switching source electrode, and the switching drain electrode may each include a metal oxide layer.

Figure 14:
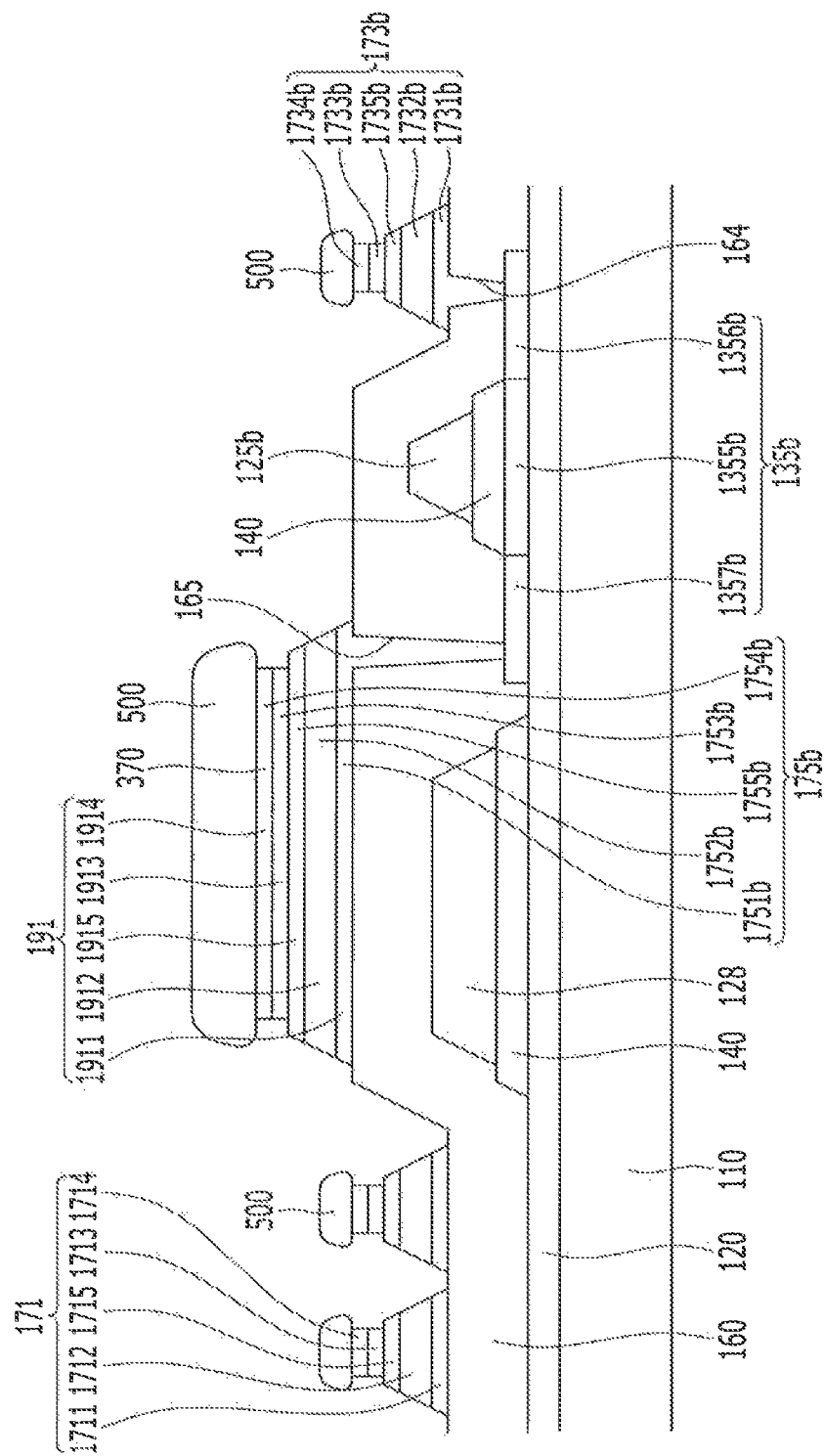

As shown in FIG. 14, the barrier metal layers (1711, 1731b, 1751b, 1911), the low resistance metal layers (1712, 1732b, 1752b, 1912), and the etch stopping layers (1715, 1735b, 1755b, 1915) are formed by using the photoresist 500 as a mask and etching the barrier metal material layer 4001, the low resistance metal material layer 4002, and the etch stopping material layer 4005. In this case, the barrier metal material layer 4001, the low resistance metal material layer 4002, and the etch stopping material layer 4005 are patterned and then etched by a dry etching process.

The barrier metal layers (1711, 1731b, 1751b, 1911) include the barrier metal layer 1711 of the data line 171, the barrier metal layer 1731b of the driving source electrode 173b, the barrier metal layer 1751b of the driving drain electrode 175b, and the barrier metal layer 1911 of the pixel electrode 191. The driving voltage line, the switching source electrode, and the switching drain electrode may each include a barrier metal layer.

The low resistance metal layers (1712, 1732b, 1752b, 1912) include the low resistance metal layer 1712 of the data line 171, the low resistance metal layer 1732b of the driving source electrode 173b, the low resistance metal layer 1752b of the driving drain electrode 175b, and the low resistance metal layer 1912 of the pixel electrode 191. The driving voltage line, the switching source electrode, and the switching drain electrode may each include a low resistance metal layer.

The etch stopping layers (1715, 1735b, 1755b, 1915) include the etch stopping layer 1715 of the data line 171, the etch stopping layer 1715 of the driving source electrode 173b, the etch stopping layer 1715 of the driving drain electrode 175b, and the etch stopping layer 1915 of the pixel electrode 191. The driving voltage line, the switching source electrode, and the switching drain electrode may each include an etch stopping layer.

According to an exemplary embodiment of the present invention, the metal oxide material layer 4004 and the contact assistant material layer 4003 are wet-etched, and then the barrier metal material layer 4001, the low resistance metal material layer 4002, and the etch stopping layer 4005 are dry-etched. Since the data line 171, the driving source electrode 173b, the driving drain electrode 175b, and the pixel electrode 191 are patterned by two processes, stepped shapes may be formed at the edges of these elements. For example, the edges of the data line 171, the driving source electrode 173b, the driving drain electrode 175b, and the pixel electrode 191 are formed to have a step shape. Steps may be formed between the contact assistant layers (1713, 1733b, 1753b, 1913) and the etch stopping layers (1715, 1735b, 1755b, 1915).

When the contact assistant material layer 4003 is patterned through the dry etching process, some portion thereof may remain as residue. For example, when the contact assistant material layer 4003 includes an aluminum-nickel-lanthanum alloy and is dry-etched, a component of nickel or lanthanum may remain as residue. To prevent the occurrence of residue, if the contact assistant material layer 4003 is patterned through a wet etching process, the low resistance metal material layer 4002 disposed below the contact assistant material layer 4003 may be etched as well. For example, since there is no etchant with selectivity between the contact assistant material layer 4003 and the low resistance metal material layer 4002, the contact assistant material layer 4003 might not be able to be patterned through the wet etching process and the low resistance metal material layer 4002 might not be able to be patterned through the dry etching process.

According to an exemplary embodiment of the present invention, since the etch stopping material layer 4005 is disposed between the low resistance metal layer 4002 and the contact assistant material layer 4003, although the contact assistant material layer 4003 is patterned through the wet etching process, the low resistance metal layer 4002 is protected by the etch stopping material layer 4005. Accordingly, by wet-etching the contact assistant material layer 4003, it is possible to prevent the residue from occurring, and in this case, it is possible to prevent the low resistance metal layer 4002 from being etched.

Figure 15:
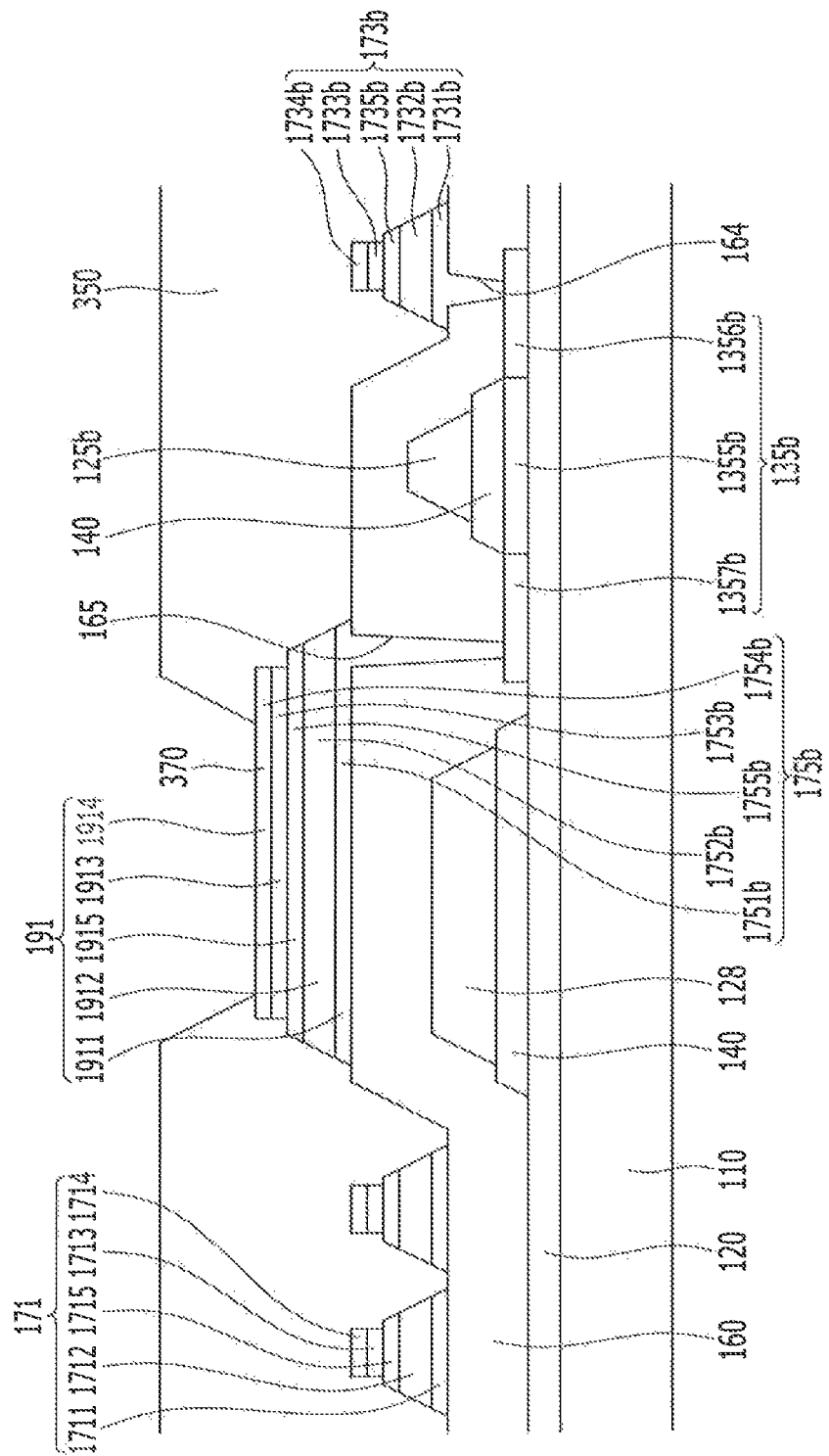

After removing the photoresist 500, as shown in FIG. 15, the pixel defining layer 350 is formed. The pixel opening 351, which exposes the pixel electrode 191, is formed by patterning the pixel defining layer 350.

Figure 16:
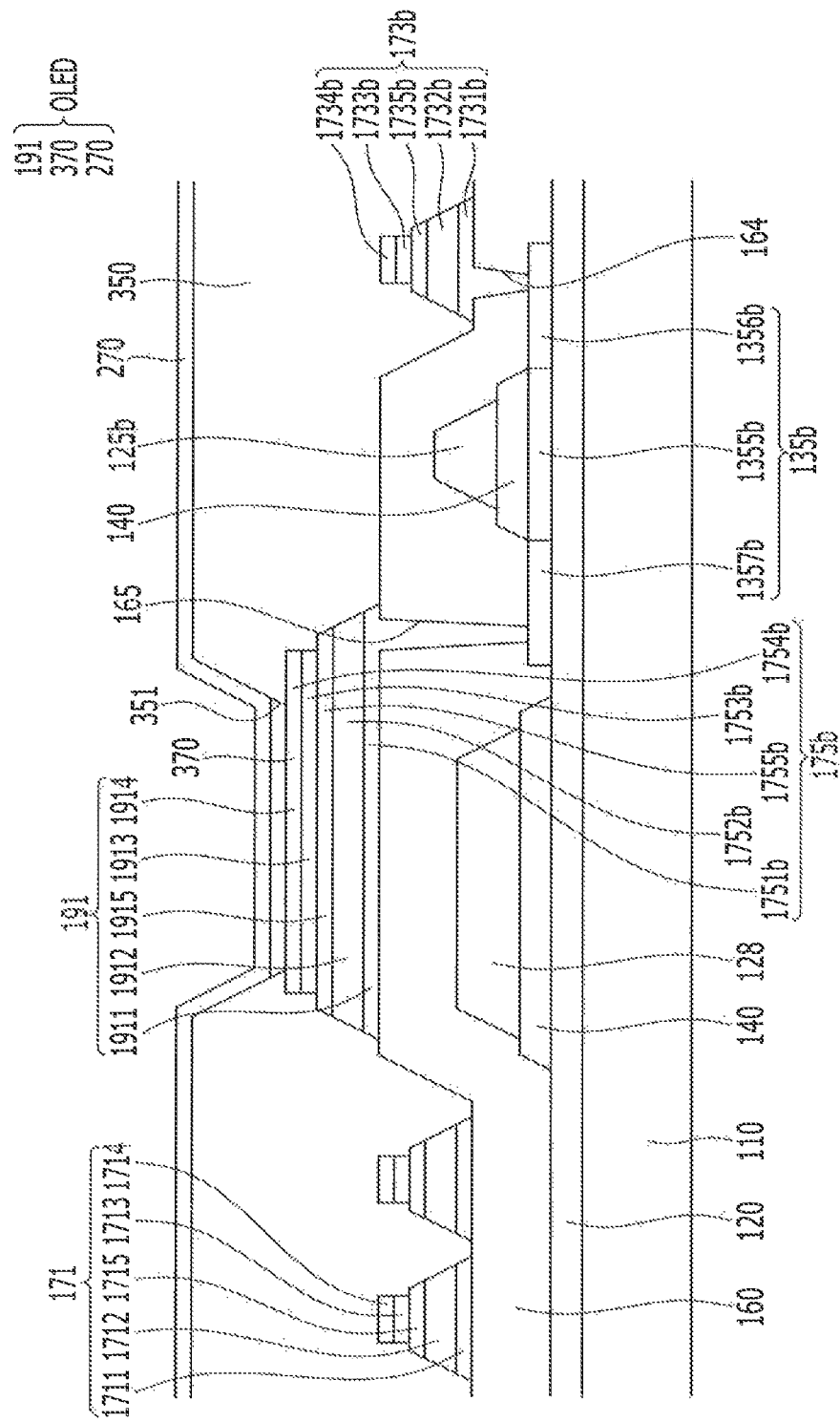

As shown in FIG. 16, the organic emission layer 370 is formed in the pixel opening 351. The common electrode 270 is disposed on the pixel defining layer 350 and the organic emission layer 370.

The organic light emitting diode display according to an exemplary embodiment of the present disclosure will be described below with reference to FIG. 17 and FIG. 18.

Figure 17:
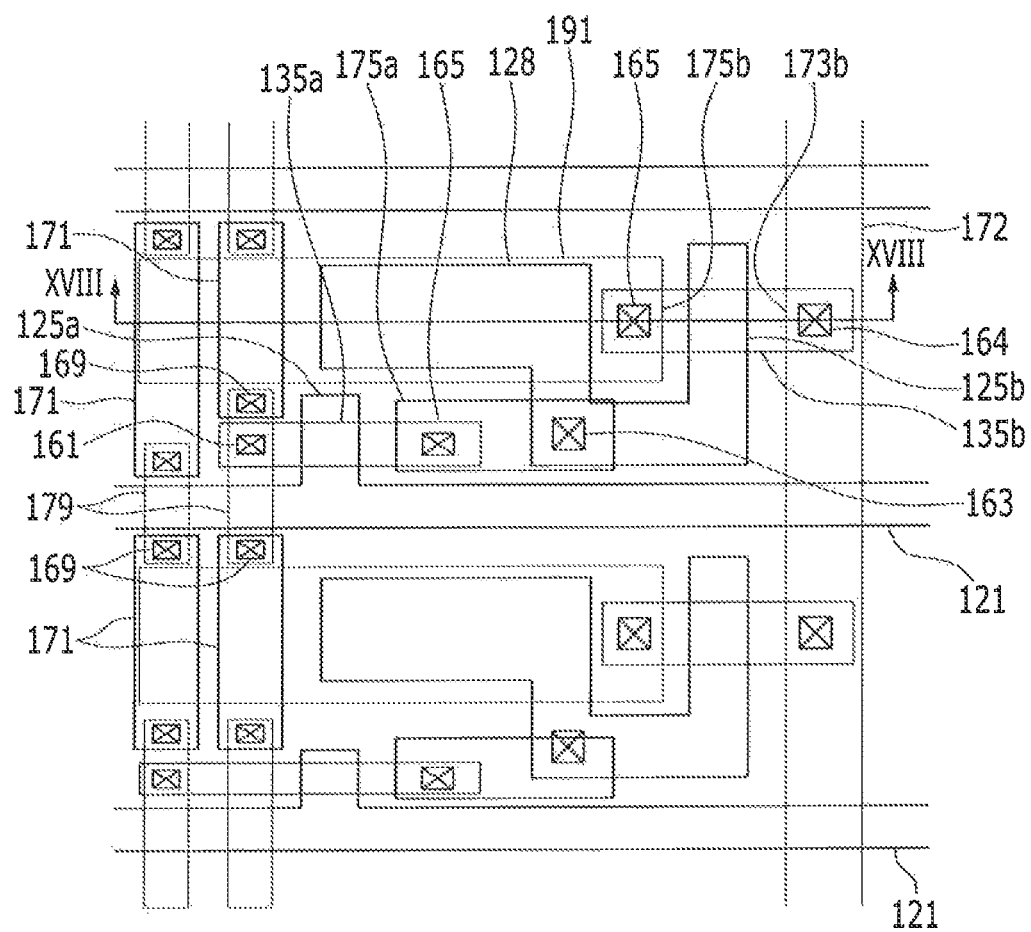
FIG. 17 is a layout view illustrating two adjacent pixels of an organic light emitting diode display according to an exemplary embodiment of the present disclosure.
Figure 18:
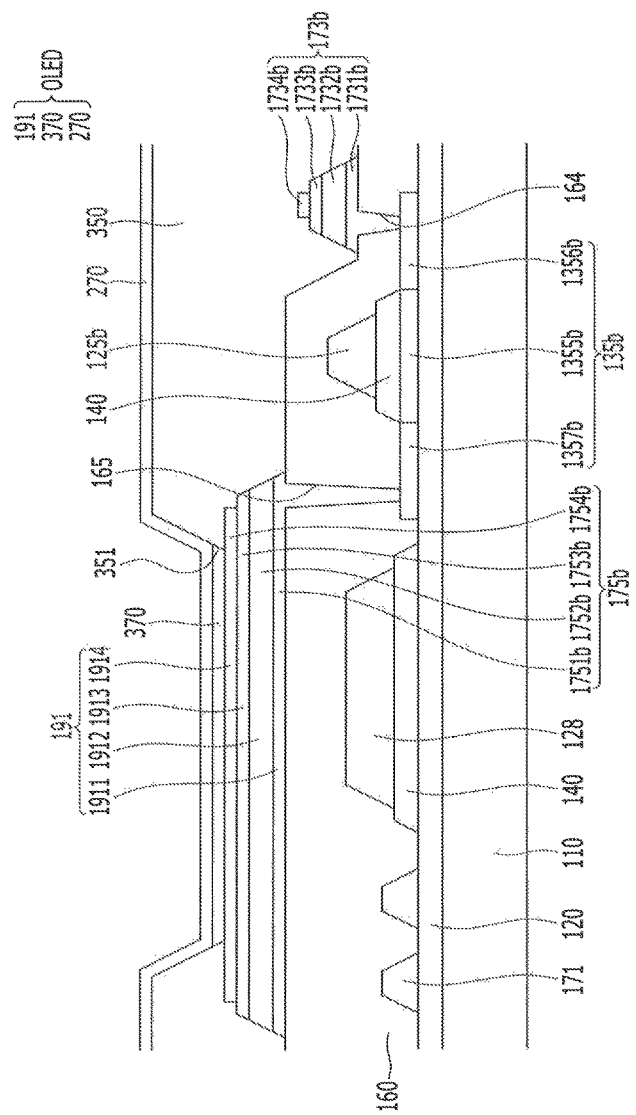
FIG. 18 is a cross-sectional view taken along line XVIII-XVIII of FIG. 17.

The organic light emitting diode display according to an exemplary embodiment of the present disclosure shown in FIGS. 17 and 18 includes many portions that are the same as in the organic light emitting diode display according to the exemplary embodiment of the present disclosure shown in FIGS. 1 to 3. Identical elements are not described again, and accordingly, it may be assumed that where an element is not described, that element may be similar to or identical to corresponding elements previously described. In the present exemplary embodiment, the feature in which the data line is disposed in the same layer as the gate line is different from the previous exemplary embodiment, and will now be described in detail.

FIG. 17 is a layout view illustrating two adjacent pixels of the organic light emitting diode display according to an exemplary embodiment of the present disclosure, and FIG. 18 is a cross-sectional view taken along line XVIII-XVIII of FIG. 17.

As shown in FIG. 17 and FIG. 18, in the organic light emitting diode display according to an exemplary embodiment of the present disclosure, the buffer layer 120 is disposed on the substrate 110, and the switching semiconductor 135a and the driving semiconductor 135b are disposed on the buffer layer 120. The gate insulating layer 140 is disposed on the switching semiconductor 135a, the driving semiconductor 135b, and the buffer layer 120.

The gate line 121, the switching gate electrode 125a, the driving gate electrode 125b, and the first storage capacitor plate 128 are disposed on the gate insulating layer 140, and the data line 171 is disposed on the buffer layer 120.

The data line 171 may include a same material as the gate line 121, and the data line 171 is disposed in the same layer as the gate line 121. The data line 171 is formed together in a process of forming the gate line 121, the switching gate electrode 125a, the driving gate electrode 125b, and the first storage capacitor plate 128.

The gate line 121 and the data line 171 extend in directions substantially perpendicular to each other. Since different signals are applied to the gate line 121 and the data line 171, the gate line 121 and the data line 171 are spaced apart from each other so as not to be short-circuited. The data line 171 may consist of several portions cut around the gate line 121.

The interlayer insulating layer 160 is disposed on the gate line 121, the switching gate electrode 125a, the driving gate electrode 125b, the first storage capacitor plate 128, and the data line 171.

A contact hole 169 overlapping at least some of the data line 171 is provided in the interlayer insulating layer 160. For example, the contact hole 169 overlaps an end portion of the data line 171.

A data connecting member 179, the driving voltage line 172, the switching source electrode 173a, the driving source electrode 173b, the switching drain electrode 175a, the driving drain electrode 175b, and the pixel electrode 191 are disposed on the interlayer insulating layer 160.

The data connecting member 179 may include a same material as the driving voltage line 172, the switching source electrode 173a, the driving source electrode 173b, the switching drain electrode 175a, the driving drain electrode 175b, and the pixel electrode 191. The data connecting member 179 is disposed in the same layer as the driving voltage line 172, the switching source electrode 173a, the switching drain electrode 175a, the driving drain electrode 175b, and the pixel electrode 191. The data connecting member 179 is formed together with the driving voltage line 172, the switching source electrode 173a, the driving source electrode 173b, the switching drain electrode 175a, the driving drain electrode 175b, and the pixel electrode 191, as part of a single process.

The data connecting member 179 may include a barrier metal layer, a low resistance metal layer, a contact assistant layer, and a metal oxide layer. However, exemplary embodiments of the present invention are not limited thereto, and the data connecting member 179 may include a barrier metal layer, a low resistance metal layer, an etch stopping layer, a contact assistant layer, and a metal oxide layer.

The data connecting member 179 connects adjacent data lines 171, and connects the data line 171 and the switching source electrode 173a. The data connecting member 179 is connected to the data line 171 through the contact hole 169.

While this disclosure has been described in connection with what is presently considered to be practical exemplary embodiments, it is to be understood that the invention is not limited to the disclosed embodiments, but, on the contrary, is intended to cover various modifications and equivalent arrangements.

What is claimed is:

1. An organic light emitting diode display device, comprising:
   a substrate;
   a semiconductor disposed on the substrate;
   a gate electrode disposed on the semiconductor;
   a source electrode connected to a first portion of the semiconductor;
   a drain electrode connected to a second portion of the semiconductor; and
   a pixel electrode connected to the drain electrode,
   wherein each of the source electrode, the drain electrode, and the pixel electrode includes:
   a barrier metal layer;
   a low resistance metal layer disposed on the barrier metal layer;
   a metal oxide layer disposed on the low resistance metal layer; and
   a contact assistant layer disposed between the low resistance metal layer and the metal oxide layer.

2. The organic light emitting diode display of claim 1, wherein the source electrode, the drain electrode, and the pixel electrode each have a step in which the contact assistant layer is wider than the metal oxide layer, and the metal oxide layer is disposed directly on the contact assistant layer.

3. The organic light emitting diode display of claim 2, wherein
   the contact assistant layer has a bottom width that is larger than a top width thereof, the low resistance metal layer has a bottom width equal in size to the top width of the contact assistant layer and the low resistance metal layer has a top width that is smaller than the bottom width thereof, and the barrier metal layer has a bottom width that is equal in size to the top width of the low resistance metal layer and the barrier metal layer has a top width that is smaller than the bottom width thereof.

4. The organic light emitting diode display of claim 2, wherein
   the barrier metal layer includes titanium, molybdenum, a titanium alloy, or a molybdenum alloy,
   the low resistance metal layer includes aluminum, copper, an aluminum alloy, or a copper alloy,
   the contact assistant layer includes an alloy of aluminum and nickel, lanthanum, germanium, copper, cobalt, or neodymium, and the metal oxide layer includes indium-tin oxide, indium-zinc oxide, zinc oxide, or indium oxide.

5. The organic light emitting diode display of claim 4, wherein
the contact assistant layer includes an aluminum-nickel-lanthanum alloy.

6. The organic light emitting diode display of claim 2, wherein
the source electrode, the drain electrode, and the pixel electrode are disposed in a same layer.

7. The organic light emitting diode display of claim 2, wherein
the drain electrode and the pixel electrode are integrally formed.

8. The organic light emitting diode display of claim 2, wherein
each of the source electrode, the drain electrode, and the pixel electrode additionally includes an etch stopping layer disposed between the low resistance metal layer and the contact assistant layer.

9. The organic light emitting diode display of claim 8, wherein
the etch stopping layer includes titanium or molybdenum.

10. The organic light emitting diode display of claim 2, further comprising:
a gate line connected to the gate electrode;
a data line disposed in a same layer as the gate line and spaced apart from the gate line; and
a data connector that connects the data line and the source electrode.

11. A method of manufacturing an organic light emitting diode display, comprising:
forming a semiconductor on a substrate;
forming a gate electrode on the semiconductor;
forming an interlayer insulating layer on both the semiconductor and the gate electrode;
patterning the interlayer insulating layer to form a contact hole that exposes a first portion and a second portion of the semiconductor;
sequentially depositing a barrier metal material layer, a low resistance metal material layer, a contact assistant material layer, and a metal oxide material layer on the interlayer insulating layer; and
forming a source electrode connected to the first portion of the semiconductor, a drain electrode connected to the second portion of the semiconductor, and a pixel electrode connected to the second portion of the semiconductor layer, by patterning the barrier metal material layer, the low resistance metal material layer, the contact assistant material layer, and the metal oxide material layer.

12. The method of claim 11, wherein the source electrode, the drain electrode, and the pixel electrode are each formed to have a step in which the contact assistant material layer is wide than the metal oxide material layer, and the metal oxide material layer is formed directly on the first layer.

13. The method of claim 12, wherein,
the patterning of the barrier metal material layer, the low resistance metal material layer, the contact assistant material layer, and the metal oxide material layer includes:
forming a metal oxide layer by patterning the metal oxide material layer; and
forming a barrier metal layer, a low resistance metal layer, and a contact assistant layer by simultaneously patterning the barrier metal material layer, the low resistance metal material layer, and the contact assistant material layer.

14. The method of claim 13, wherein,
the patterning of the metal oxide material layer is performed by a wet etching method, and
the patterning of the barrier metal material layer, the low resistance metal material layer, and the contact assistant material layer is performed by a dry etching method.

15. The method of claim 12, wherein
the barrier metal layer includes titanium, molybdenum, a titanium alloy, or a molybdenum alloy,
the low resistance metal layer includes aluminum, copper, an aluminum alloy, or a copper alloy,
the contact assistant layer includes an alloy of aluminum and nickel, lanthanum, germanium, copper, cobalt, or neodymium, and
the metal oxide layer includes indium-tin oxide, indium-zinc oxide, zinc oxide, or indium oxide.

16. The method of claim 12, further comprising:
depositing an etch stopping material layer between the low resistance metal material layer and the contact assistant material layer,
wherein the source electrode, the drain electrode, and the pixel electrode are formed by patterning the barrier metal material layer, the low resistance metal material layer, the etch stopping material layer, the contact assistant material layer, and the metal oxide material layer.

17. The method of claim 16, wherein,
the patterning of the barrier metal material layer, the low resistance metal material layer, the etch stopping material layer, the contact assistant material layer, and the metal oxide material layer includes:
forming a metal oxide layer and a contact assistant layer by patterning the contact assistant material layer and the metal oxide material layer; and
forming the barrier metal layer, the low resistance metal layer, and an etch stopping layer by patterning the barrier metal material layer, the low resistance metal material layer, and the etch stopping material layer.

18. The method of claim 17, wherein,
the patterning of the contact assistant material layer and the metal oxide material layer is performed by a wet etching method, and
the patterning of the barrier metal material layer, the low resistance metal material layer, and the etch stopping material layer is performed by a dry etching method.

19. The method of claim 18, wherein,
the etch stopping material layer includes titanium or molybdenum.

20. The method of claim 12, wherein,
in the forming of the gate electrode,
a gate line connected to the gate electrode is formed concurrently with a data line that is spaced apart from the gate line, and
in the forming of the source electrode,
a data connecting member connecting the data line and the source electrode is formed.

* * * * *